(12) United States Patent
Matsuura

(10) Patent No.: US 8,502,716 B1
(45) Date of Patent: Aug. 6, 2013

(54) CALIBRATION FOR RFDAC

(75) Inventor: Toru Matsuura, Kanagawa (JP)

(73) Assignee: Panasonic Corporation, Osaka (JP)

( * ) Notice: Subject to any disclaimer, the term of this patent is extended or adjusted under 35 U.S.C. 154(b) by 25 days.

(21) Appl. No.: 13/418,086

(22) Filed: Mar. 12, 2012

(51) Int. Cl.
*H03M 1/66* (2006.01)

(52) U.S. Cl.
USPC ............ 341/120; 341/144; 375/260; 375/146

(58) Field of Classification Search
USPC ................. 341/144, 120, 118, 145; 375/146, 375/295, 296, 260
See application file for complete search history.

(56) References Cited

U.S. PATENT DOCUMENTS 6,442,192 B1 * 8/2002 Senda ............................ 375/146
8,036,285 B2 * 10/2011 Awad ............................ 375/260

\* cited by examiner

*Primary Examiner* — Jean B Jeanglaude

(57) ABSTRACT

Phase errors are reduced in an RFDAC. The RFDAC includes: a multi-phase radio-frequency signal generator that generates multiple radio-frequency signal pairs each having a phase difference of $\pi$; a vector selector that combines each of the multiple radio-frequency signals which has passed through at least one path; a test signal generator that generates a test signal; a multiplexer that selects either the test signal or the baseband signal; a vector controller that controls the vector selector so as to select a path for each of the multiple radio-frequency signal pairs; a detector that detects output signals outputted from the vector selector; a calibrator that, based on the output signals, calculates a calibration coefficient of a phase error between the radio-frequency signals of each of the multiple radio-frequency signal pairs, and calibrates the multiple radio-frequency signals or the baseband signal.

19 Claims, 22 Drawing Sheets

| Condition | $I_O$ | $Q_O$ |
|---|---|---|
| $I_I > 0, Q_I \geq 0$ | $I_O$ | $Q_O$ |
| $I_I \leq 0, Q_I > 0$ | $I_I + Q_I \sin\theta_2$ | $Q_I \cos\theta_2$ |
| $I_I < 0, Q_I \leq 0$ | $I_I \cos\theta_4 + Q_I \sin\theta_2$ | $Q_I \cos\theta_2 - I_I \sin\theta_4$ |
| $I_I \geq 0, Q_I < 0$ | $I_I \cos\theta_4 + Q_I \sin\theta_6$ | $Q_I \cos\theta_6 - I_I \sin\theta_2$ |
|  | $I_I + Q_I \sin\theta_6$ | $Q_I \cos\theta_6$ |

(b)

| Condition | $I_O$ | $Q_O$ |
|---|---|---|
| $I_I > 0, Q_I \geq 0$ | $I_O$ | $Q_O$ |
| $I_I \leq 0, Q_I > 0$ | $I_I + Q_I \theta_2$ | $Q_I$ |
| $I_I < 0, Q_I \leq 0$ | $I_I + Q_I \theta_2$ | $Q_I - I_I \theta_2$ |
| $I_I \geq 0, Q_I < 0$ | $I_I + Q_I \theta_6$ | $Q_I - I_I \theta_6$ |
|  | $I_I + Q_I \theta_6$ | $Q_I$ |

FIG. 15

| zone | Condition | + axis Number | + axis Phase (θ1) | x axis Number | x axis Phase (θ2) |
|---|---|---|---|---|---|
| #1 | $I≥0, Q≥0, I>Q$ | $I-Q$ | $0$ | $Q$ | $π/4$ |
| #2 | $I>0, Q>0, I≤Q$ | $Q-I$ | $π/2$ | $I$ | $π/4$ |
| #3 | $I≤0, Q>0, |I|<Q$ | $Q-|I|$ | $π/2$ | $|I|$ | $3π/4$ |
| #4 | $I<0, Q>0, |I|≥Q$ | $|I|-Q$ | $π$ | $Q$ | $3π/4$ |
| #5 | $I<0, Q≤0, |I|>|Q|$ | $|I|-|Q|$ | $π$ | $|Q|$ | $-3π/4$ |
| #6 | $I<0, Q<0, |I|≤|Q|$ | $|Q|-|I|$ | $-π/2$ | $|I|$ | $-3π/4$ |
| #7 | $I≥0, Q<0, I<|Q|$ | $|Q|-I$ | $-π/2$ | $I$ | $-π/4$ |
| #8 | $I>0, Q<0, I≥|Q|$ | $I-|Q|$ | $0$ | $|Q|$ | $-π/4$ |

FIG. 17

| zone | Condition | $I_O$ | $Q_O$ |
|---|---|---|---|
| #1 | $I \geq 0, Q \geq 0, I > Q$ | $I_I + Q_I(-1 + \cos\theta_1 + \sin\theta_1)$ | $Q_I(\cos\theta_1 - \sin\theta_1)$ |
| #2 | $I > 0, Q > 0, I \leq Q$ | $I_I(\cos\theta_1 + \sin\theta_1 - \sin\theta_2) + Q_I \sin\theta_2$ | $Q_I \cos\theta_2 + I_I(\cos\theta_1 - \sin\theta_1 - \cos\theta_2)$ |
| #3 | $I \leq 0, Q > 0, |I| < Q$ | $I_I(\cos\theta_3 - \sin\theta_3 + \sin\theta_2) + Q_I \sin\theta_2$ | $Q_I \cos\theta_2 + I_I(\cos\theta_2 - \cos\theta_3 - \sin\theta_3)$ |
| #4 | $I < 0, Q > 0, |I| \geq Q$ | $I_I \cos\theta_4 + Q_I(\cos\theta_4 - \cos\theta_3 + \sin\theta_3)$ | $Q_I(\cos\theta_3 + \sin\theta_3 - \sin\theta_4) - I_I \sin\theta_4$ |
| #5 | $I < 0, Q \leq 0, |I| > |Q|$ | $I_I \cos\theta_4 + Q_I(\cos\theta_5 - \cos\theta_4 + \sin\theta_5)$ | $Q_I(\cos\theta_5 - \sin\theta_5 + \sin\theta_4) - I_I \sin\theta_4$ |
| #6 | $I < 0, Q < 0, |I| \leq |Q|$ | $I_I(\cos\theta_5 + \sin\theta_5 - \sin\theta_6) + Q_I \sin\theta_6$ | $Q_I \cos\theta_6 + I_I(\cos\theta_5 - \sin\theta_5 - \cos\theta_6)$ |
| #7 | $I \geq 0, Q < 0, I < |Q|$ | $I_I(\cos\theta_7 - \sin\theta_7 + \sin\theta_6) + Q_I \sin\theta_6$ | $Q_I \cos\theta_6 + I_I(\cos\theta_6 - \cos\theta_7 - \sin\theta_7)$ |
| #8 | $I > 0, Q < 0, I \geq |Q|$ | $I_I + Q_I(1 - \cos\theta_7 + \sin\theta_7)$ | $Q_I(\cos\theta_7 + \sin\theta_7)$ |

FIG. 18

| zone | Condition | $I_O$ | $Q_O$ |
|---|---|---|---|
| #1 | $I \geq 0, Q \geq 0, I > Q$ | $I_I + Q_I \theta_I$ | $Q_I(1-\theta_I)$ |
| #2 | $I > 0, Q > 0, I \leq Q$ | $I_I(1+\theta_I-\theta_2) + Q_I\theta_2$ | $Q_I - I_I\theta_I$ |
| #3 | $I \leq 0, Q > 0, |I| < Q$ | $I_I(1-\theta_3+\theta_2) + Q_I\theta_2$ | $Q_I - I_I\theta_3$ |
| #4 | $I < 0, Q > 0, |I| \geq Q$ | $I_I + Q_I\theta_3$ | $Q_I(1+\theta_3-\theta_4) - I_I\theta_4$ |
| #5 | $I < 0, Q \leq 0, |I| \geq |Q|$ | $I_I + Q_I\theta_5$ | $Q_I(1-\theta_5+\theta_4) - I_I\theta_4$ |
| #6 | $I < 0, Q < 0, |I| < |Q|$ | $I_I(1+\theta_5-\theta_6) + Q_I\theta_6$ | $Q_I - I_I\theta_5$ |
| #7 | $I \geq 0, Q < 0, I < |Q|$ | $I_I(1+\theta_6-\theta_7) + Q_I\theta_6$ | $Q_I - I_I\theta_7$ |
| #8 | $I > 0, Q < 0, I \geq |Q|$ | $I_I + Q_I\theta_7$ | $Q_I(1+\theta_7)$ |

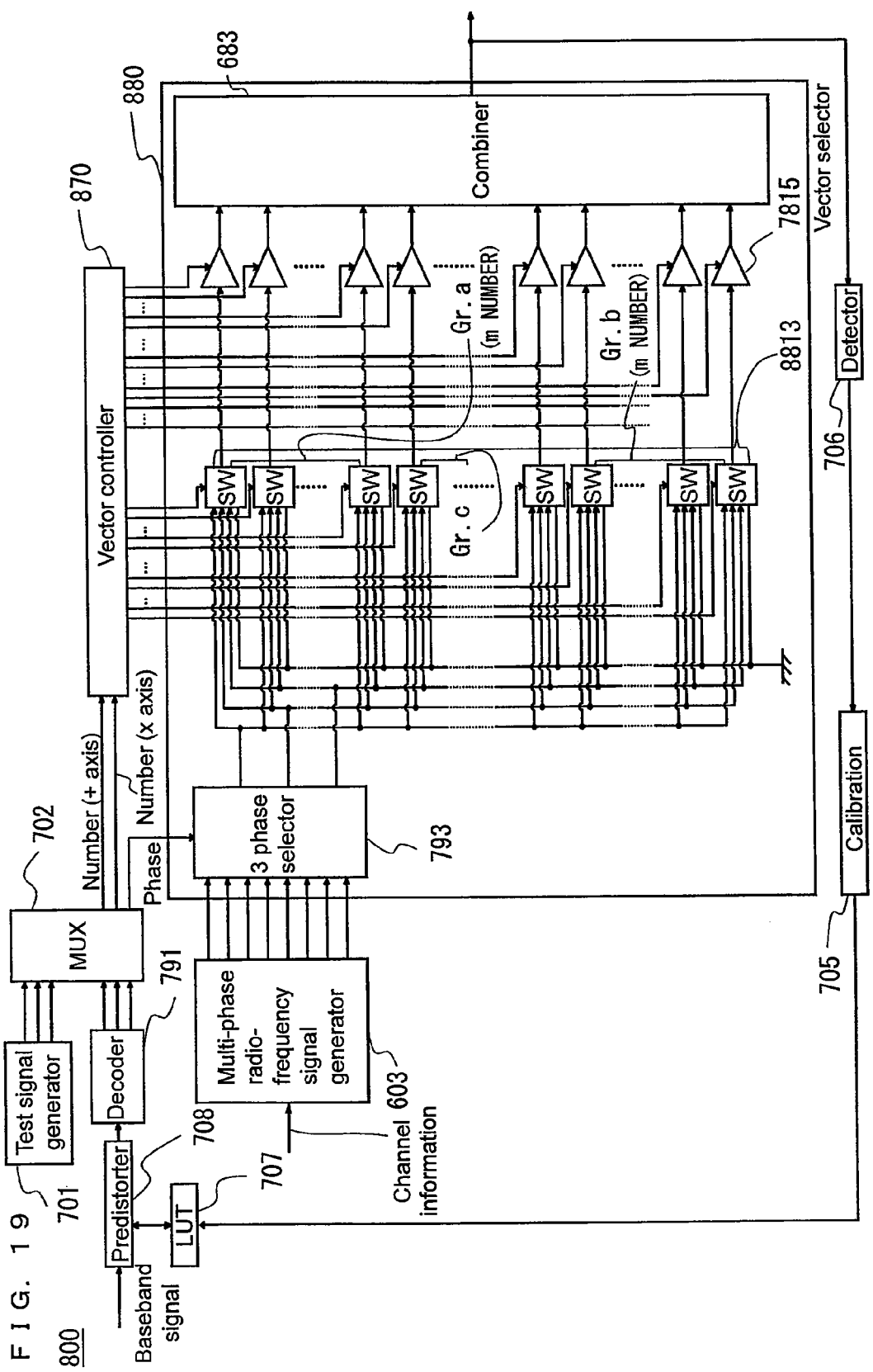

CALIBRATION FOR RFDAC

FIELD OF THE INVENTION

The present invention relates to an RFDAC (Radio Frequency Digital to Analog Converter) for converting digital signals to analog signals, and relates to an RFDAC for calibrating variation of elements and improving distortion properties.

DESCRIPTION OF THE BACKGROUND ART

Conventionally, for an RFDAC, low distortion in transmission signals is required for ensuring quality of the transmission signals. No calibration causes a problem such as spectrum regrowth and modulation accuracy degradation.

SUMMARY OF THE INVENTION

Therefore, an objective of the present invention is to reduce phase error in an RFDAC.

In order to achieve the above described objective, the present invention is an RFDAC (Radio Frequency Digital to Analog Converter) for digital-to-analog conversion on a baseband signal, the RFDAC including: a multi-phase radio-frequency signal generator configured to generate multiple pairs of radio-frequency signals in which a phase difference among each of the multiple pairs is $\pi$; a vector selector configured to combine each of the multiple radio-frequency signals which has passed through at least one path; a test signal generator configured to generate a test signal; a multiplexer configured to select either the test signal or the baseband signal; a vector controller configured to control the vector selector so as to select a path for each of the multiple pairs of the radio-frequency signals by using a signal selected by the multiplexer; a detector configured to detect output signals outputted from the vector selector; and a calibrator configured to, when the multiplexer selects the test signal, calculate a calibration coefficient of a phase error between the radio-frequency signals of the each of the multiple pairs of the radio-frequency signals outputted by multi-phase radio-frequency signal generator, based on the output signals detected by the detector, and configured to, when the multiplexer selects the baseband signal, calibrate the multiple radio-frequency signals or the baseband signal by using the calibration coefficient calculated in the test mode.

Preferably, when the multiplexer selects the test signal: the vector selector exchanges paths within each of the multiple pairs of the radio-frequency signals; the calibrator calculates the phase error between the radio-frequency signals corresponding to the multiple pairs of the radio-frequency signals, based on a phase error between each the output signals before and after exchanging of the paths.

Preferably, when the multiplexer selects the test signal, for each of the multiple pairs of the radio-frequency signals, the calibrator obtains, when a radio-frequency signal of one member a pair passes through a first path and a radio-frequency signal of the other member of the pair passes through a second path, a phase error $\theta_{1,c}$ between the radio-frequency signals corresponding to the pair, based on the output signals, obtains, when the radio-frequency signal of the one member of the pair passes through the second path and the radio-frequency signal of the other member of the pair passes through the first path, a phase error $\theta_{2,c}$ between the radio-frequency signals corresponding to the pair, based on the output signals, and calculates, using a formula of $\theta_4 = -(\theta_1 + \theta_2)/2$, a phase calibration coefficient for the pair generated by the multi-phase radio-frequency signal generator.

Furthermore, preferably, when the multiplexer selects the test signal, for each of the multiple pairs of the radio-frequency signals, the calibrator obtains, when a radio-frequency signal of one member of a pair passes through a first path and a radio-frequency signal of the other member of the pair passes through a second path, a vector error $y_1$ between the radio-frequency signals corresponding to the pair, based on the output signals, obtains, when the radio-frequency signal of the one member of the pair passes through the second path and the radio-frequency signal of the other member of the pair passes through the first path, a vector error $y_2$ between the radio-frequency signals corresponding to the pair, based on the output signals, and calculates, using a formula of $\theta_4 = \text{Im}(y_1 + y_2)/m$ (here, m represents a number of routes included in each of the first and second paths), a phase calibration coefficient for the pair generated by the multi-phase radio-frequency signal generator.

Furthermore, preferably, for each of the multiple pairs of the radio-frequency signals, when level of the output signals including the radio-frequency signals corresponding to the pair and a single radio-frequency signal not included in the pair becomes a minimum, the calibrator approximately calculates the vector errors $y_1$ and $y_2$ between the radio-frequency signals corresponding to the pair, based on a size and direction of a vector represented by the minimum output signal.

Furthermore, preferably, when the multiplexer selects the test signal, for each of the multiple pairs of the radio-frequency signals, the calibrator further calculates, using a formula of $e_{dif} = (y_1 + y_2)/(2 + j\theta_4)$ (here, formula $\theta_4 = \text{Im}(y_1 + y_2)/m$: m represents a number of routes included in each of the first and second paths), a vector error between the first path and the second path, based on the vector errors $y_1$ and $y_2$.

Furthermore, preferably, the RFDAC further includes a variable phase controller connected to an antecedent stage of the vector selector, and configured to control each phase of the multiple radio-frequency signals outputted from the multi-phase radio-frequency signal generator, based on the calibration coefficient calculated by the calibrator.

Alternatively, preferably, the RFDAC further includes: an LUT (look-up table) having stored therein the calibration coefficient calculated by the calibrator, based on the phase error; and a predistorter connected to an antecedent stage of the vector controller, and configured to conduct predistortion on the baseband signal outputted by the multiplexer, based on the calibration coefficient stored in the LUT.

Furthermore, preferably, the first phase-pair includes radio-frequency signals corresponding to phases of 0 and $\pi$, the second phase-pair includes radio-frequency signals corresponding to phases of $\pi/2$ and $-\pi/2$, and the baseband signal includes an in-phase signal and a quadrature-phase signal, and the test signal includes an in-phase component control signal and a quadrature-phase component control signal.

Furthermore, preferably: the vector controller includes an in-phase signal amplitude-and-phase controller, and a quadrature-phase signal amplitude-and-phase controller; the vector selector includes an in-phase signal vector selector, a quadrature-phase signal vector selector, and a combiner; the in-phase signal amplitude-and-phase controller controls the in-phase signal vector selector so as to select a path for each of the multiple pairs of the radio-frequency signals, based on a first signal which is the in-phase signal, when the multiplexer selects the baseband signal, or based on a first signal which is the in-phase component control signal, when the multiplexer selects the test signal; the quadrature-phase signal amplitude-and-phase controller controls the quadrature-phase signal vector selector so as to select a path for a radio-frequency signal of each pair of radio-frequency signals that are different from the pair of radio-frequency signals used by the in-phase signal amplitude-and-phase controller, based on a second signal which is the quadrature-phase signal, when the multiplexer selects the baseband signal, or based on a second signal which is the quadrature-phase component control signal, when the multiplexer selects the test signal; and the combiner combines each of the radio-frequency signals outputted by the in-phase signal amplitude-and-phase controller and the quadrature-phase signal amplitude-and-phase controller.

Furthermore, preferably: the in-phase signal vector selector includes a switch bank having multiple switches configured to select either an OFF state or radio-frequency signals corresponding to the first phase-pair among the multiple pairs of the radio-frequency signals; the quadrature-phase signal vector selector includes a switch bank having multiple switches configured to select either an OFF state or radio-frequency signals corresponding to the second phase-pair among the multiple pairs of the radio-frequency signals; the in-phase signal amplitude-and-phase controller includes an in-phase signal unit selector configured to control each of the switches in the switch bank; and the quadrature-phase signal amplitude-and-phase controller includes a quadrature-phase signal unit selector configured to control each of the switches in the switch bank.

Furthermore, preferably: the in-phase signal vector selector further includes a first switch configured to select one among the radio-frequency signals corresponding to the first phase-pair, and a second switch configured to select the radio-frequency signal that have not been selected by the first switch; the switch bank of the in-phase signal vector selector includes a first switch bank corresponding to the first switch, and a second switch bank corresponding to the second switch; the in-phase signal amplitude-and-phase controller includes an in-phase signal phase controller configured to control the first and second switches; the quadrature-phase signal vector selector further includes third and fourth switches configured to select one among the radio-frequency signals corresponding to the second phase-pair; the switch bank of the quadrature-phase signal vector selector includes a third switch bank corresponding to the third switch, and a fourth switch bank corresponding to the fourth switch; and the quadrature-phase signal amplitude-and-phase controller includes a quadrature-phase signal phase controller configured to control the third and fourth switches.

Furthermore, preferably: the in-phase signal vector selector includes a first switch configured to select one among the radio-frequency signals corresponding to the first phase-pair among the multiple pairs of the radio-frequency signals, a second switch configured to select the radio-frequency signal that have not been selected by the first switch, a first amplifier configured to amplify, based on the first signal, the radio-frequency signal selected by the first switch, and a second amplifier configured to amplify, based on the first signal, the radio-frequency signal selected by the second switch; the in-phase signal amplitude-and-phase controller includes an in-phase signal phase controller configured to control the first and second switches in accordance with the first signal, and an in-phase signal amplitude controller configured to control an amplification factor of each of the first and second amplifiers in accordance with the first signal; the quadrature-phase signal vector selector includes a third switch configured to select one among the radio-frequency signals corresponding to the second phase-pair among the multiple pairs of the radio-frequency signals, a fourth switch configured to select the radio-frequency signal that has not been selected by the second switch, a third amplifier configured to amplify, in accordance with the second signal, the radio-frequency signal selected by the third switch, and a fourth amplifier configured to amplify, in accordance with the second signal, the radio-frequency signal selected by the fourth switch; the quadrature-phase signal amplitude-and-phase controller includes a quadrature-phase signal phase controller configured to control the third and fourth switches in accordance with the second signal, and a quadrature-phase signal amplitude controller configured to control an amplification factor of each of the third and fourth amplifiers in accordance with the second signal; and when the multiplexer selects the test signal, the in-phase signal amplitude controller conducts a control so as to equalize amplification factors of the first and second amplifiers, and the quadrature-phase signal amplitude controller conducts a control so as to equalize the amplification factors of the third and fourth amplifiers.

Furthermore, preferably: the vector controller includes an in-phase signal amplitude-and-phase controller, and a quadrature-phase signal amplitude-and-phase controller; the vector selector includes an in-phase signal vector selector, a quadrature-phase signal vector selector, a combiner, and first and second switches configured to select radio-frequency signals of the first phase-pair among the multiple pairs of the radio-frequency signals; the in-phase signal vector selector includes a fifth switch bank having multiple switches configured to select either an OFF state or the radio-frequency signal selected by the first switch; the in-phase signal amplitude-and-phase controller includes an in-phase signal phase controller configured to control the first switch, and an in-phase signal unit selector configured to control each of the switches of the first switch bank; the quadrature-phase signal vector selector includes a sixth switch bank having multiple switches configured to select either an OFF state or the radio-frequency signal selected by the second switch; and the quadrature-phase signal amplitude-and-phase controller includes an in-phase signal phase controller configured to control the second switch, and a quadrature-phase signal unit selector configured to control each of the switches of the second switch bank.

Furthermore, preferably, the RFDAC further includes a decoder configured to receive the baseband signal which is an I-Q signal, configured to convert the baseband signal into a linear sum of two vectors in which an angle therebetween is $\pi/4$, and that have non-negative coefficients, and that are two among eight vectors whose directions are in eight phases of $-\pi/2, 0, \pi/2, \pi, -3\pi/4, -\pi/4, \pi/4,$ and $3\pi/4$, and configured to output, in a predetermined format, information regarding phases and sizes of the two vectors; wherein the multi-phase radio-frequency signal generator generates and outputs, as the multiple radio-frequency signals, eight radio-frequency signals corresponding to the eight phases; when the multiplexer selects the test signal, the vector selector is controlled so as to sequentially select a pair that is from among the eight radio-frequency signals and in which a phase difference among the pair is $\pi$, and the calibrator sequentially calculates, based on an output from the vector selector detected by the detector, a phase error among a pair that is from among the eight radio-frequency signals and in which a phase difference among the pair is $\pi$; and when the multiplexer selects the baseband signal, the vector controller controls the vector selector so as to select radio-frequency signals corresponding to phases of the two vectors, among the eight radio-frequency signals.

Furthermore, preferably: the vector selector includes a two-phase selector configured to select two radio-frequency signals among the eight radio-frequency signals, a switch bank having, as paths of the two radio-frequency signals selected by the two-phase selector, multiple switches configured to each select either an OFF state or one of the two radio-frequency signals selected by the two-phase selector, and a combiner configured to combine radio-frequency signals selected by each of the switches of the switch bank; when the multiplexer selects the test signal, the two-phase selector selects, among the eight radio-frequency signals, a first pair in which a phase difference among the pair is $\pi$, the vector controller sequentially controls each of the switches, and causes paths to be exchanged within the first pair, the calibrator calculates a phase error between radio-frequency signals corresponding to the first and second phases generated by the multi-phase radio-frequency signal generator, based on the output signals each detected by the detector in the first and second states; when the multiplexer selects the baseband signal, the two-phase selector selects two radio-frequency signals corresponding to phases of the two vectors, and the vector controller controls each of the switches of the switch bank so as to each select either an OFF state or one of the two radio-frequency signals, based on a size of the two vectors.

Furthermore, preferably: the vector selector includes a three-phase selector configured to select first, second, and third radio-frequency signals among the eight radio-frequency signals, a switch bank having, as paths of the first, second, and third radio-frequency signals, multiple switches configured to each select either an OFF state or one of the first and second radio-frequency signals selected by the three-phase selector, and multiple switches configured to each select either an OFF state or the third radio-frequency signal, and a combiner configured to combine the radio-frequency signals selected by each of the switches of the switch bank; when the multiplexer selects the test signal, the three-phase selector selects, as the first, second, and third radio-frequency signals, radio-frequency signals each corresponding to the pair having a first phase and a second phase in which a phase difference therebetween is $\pi$ and to a third phase whose phase difference from the first and second phases is $\pi/2$, the vector controller sequentially controls each of the switches, and causes paths to be exchanged within the pair of the first phase and the second phase from among the switches of the switch bank, and the calibrator calculates, when an output level of each of the output signals detected by the detector in the first state and the second state becomes a minimum, a phase error between the first and second radio-frequency signals generated by the multi-phase radio-frequency signal generator, based on an output level of the third radio-frequency signal; and when the multiplexer selects the baseband signal, the three-phase selector selects, as radio-frequency signals corresponding to the first and second phases, two radio-frequency signals corresponding to the phases of the two vectors, and the vector controller controls each of the switches of the switch bank so as to each select either an OFF state or one of the two radio-frequency signals, based on the size of the two vectors.

Furthermore, preferably: the vector selector includes a three-phase selector configured to select, first, second, and third radio-frequency signals among the eight radio-frequency signals, a switch bank having, as paths of the first, second, and third radio-frequency signals, multiple switches configured to each select either an OFF state or one of the first, second, and third radio-frequency signals selected by the three-phase selector, and a combiner configured to combine the radio-frequency signals selected by each of the switches of the switch bank; when the multiplexer selects the test signal, the three-phase selector selects, as the first, second, and third radio-frequency signals, radio-frequency signals corresponding to the pair having a first phase and a second phase in which a phase difference there between is $\pi$ and to a third phase whose phase difference from the first and second phases is $\pi/2$, the vector controller sequentially controls each of the switches, and causes respective paths of the first phase, the second phase, and the third phase to be exchanged from among the switches of the switch bank, and the calibrator calculates, when an output level of each of the output signals detected by the detector in the first and second states becomes a minimum, a phase error between the first and second radio-frequency signals generated by the multi-phase radio-frequency signal generator, based on an output level of the third radio-frequency signal; and when the multiplexer selects the baseband signal, the three-phase selector selects, as the first and second radio-frequency signals, two radio-frequency signals corresponding to the phases of the two vectors, and the vector controller controls each of the switches of the switch bank so as to each select either an OFF state or one of the two radio-frequency signals, based on the size of the two vectors.

Furthermore, the present invention is also directed toward a wireless communication apparatus including: an antenna; an antenna switch connected to the antenna; a receiver connected to the antenna switch; a transmitter connected to the antenna switch and having incorporated therein the above described RFDAC.

Furthermore, in order to achieve the above described objective, processes performed by respective components of the RFDAC of the present invention can be regarded as a distortion calibration method that provides a series of process steps. This method is provided in a form of a program causing a computer to execute the series of process steps. The program may be stored on a computer readable non-temporary storage medium to be installed on the computer.

As described above, with the present invention, a phase error can be reduced in the RFDAC.

The present invention is useful for transmitters that transmit RF signals, wireless communication apparatuses being incorporated with such transmitters, and the like.

These and other objects, features, aspects and advantages of the present invention will become more apparent from the following detailed description of the present invention when taken in conjunction with the accompanying drawings.

BRIEF DESCRIPTION OF THE DRAWINGS

FIG. 12 shows processes executed by the RFDAC 500 according to the fifth embodiment of the present invention;

FIG. 15 shows processes executed by the RFDAC 600 according to the sixth embodiment of the present invention;

FIG. 17 shows processes executed by the RFDAC 700 according to the fifth embodiment of the present invention;

FIG. 18 shows processes executed by the RFDAC 700 according to the fifth embodiment of the present invention;

FIG. 19 shows an RFDAC 800 according to an eighth embodiment of the present invention;

DESCRIPTION OF THE PREFERRED EMBODIMENTS

[First Embodiment]

Figure 1:
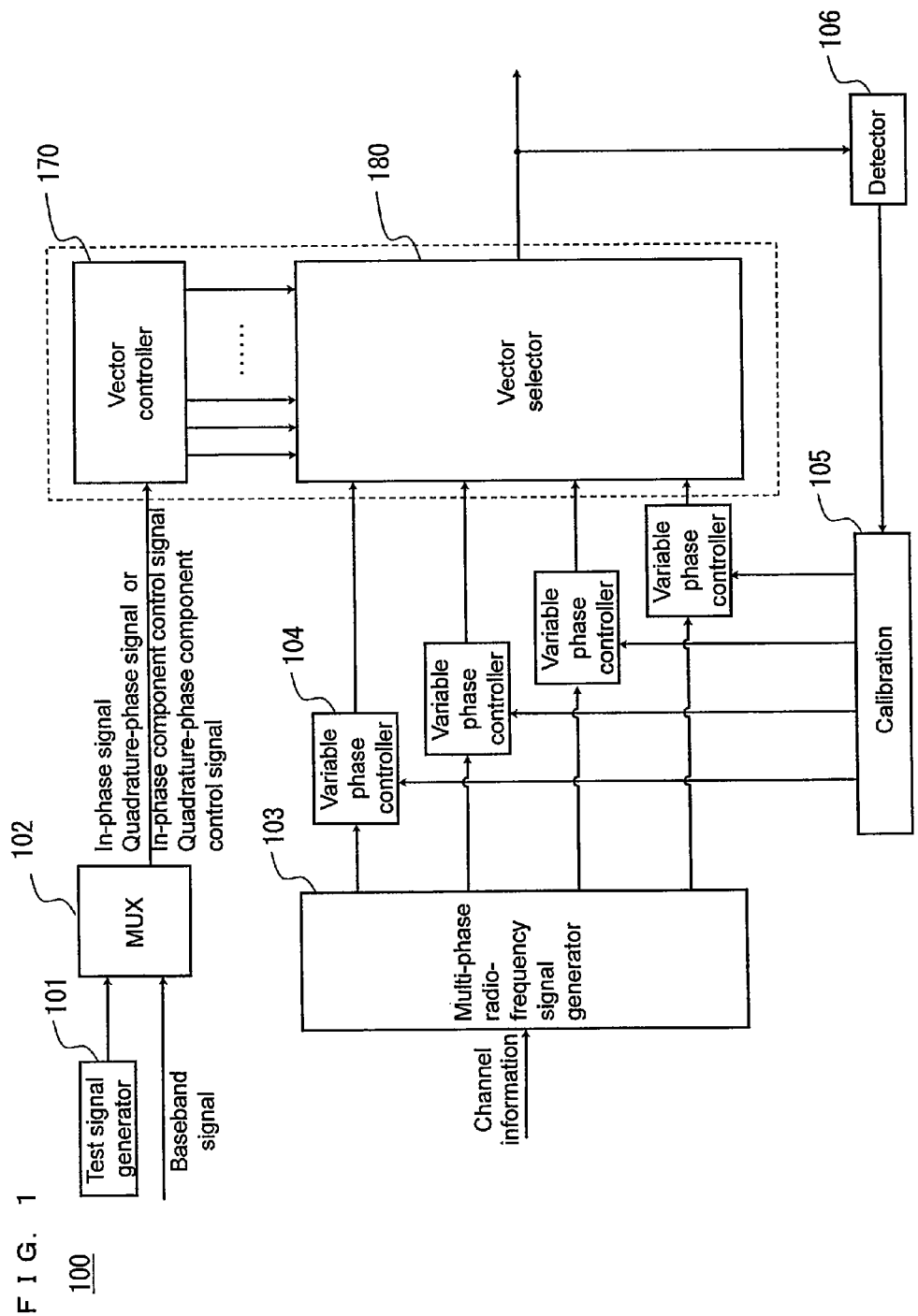
FIG. 1 shows an RFDAC 100 according to a first embodiment of the present invention.

FIG. 1 shows a general outline of an RFDAC 100 according to the present embodiment. The RFDAC 100 includes a test signal generator 101, a multiplexer 102, a vector controller 170, a multi-phase radio-frequency signal generator 103, variable phase controllers 104, a calibrator 105, a detector 106, and a vector selector 180.

The test signal generator 101 generates a test signal. The multiplexer 102 selects either one of a baseband signal and the test signal. The test signal is a signal for controlling amplitudes of two or three radio-frequency signals selected from multiple radio-frequency signals that have mutually different phases and are outputted by the multi-phase radio-frequency signal generator 103, and includes an in-phase component control signal and a quadrature-phase component control signal. The baseband signal is an I-Q signal that also includes an in-phase signal and a quadrature-phase signal. The in-phase signal represents an in-phase component, and the quadrature-phase signal represents a quadrature-phase component. The vector controller 170 controls the vector selector 180 based on a signal outputted from the multiplexer 102.

The multi-phase radio-frequency signal generator 103 generates multiple radio-frequency signals having mutually different phases. In the present embodiment, as one example, radio-frequency signals whose respective phases are 0, $\pi/2$, $\pi$, and $-\pi/2$ (radian) are outputted. The frequencies of these radio-frequency signals are determined based on channel information inputted to the multi-phase radio-frequency signal generator 103.

The multiple radio-frequency signals outputted from the multi-phase radio-frequency signal generator 103 are each inputted in the vector selector 180 via the variable phase controllers 104. The vector selector 180 is controlled by the vector controller 170, and selects, combines, and the outputs the inputted radio-frequency signals.

The detector 106 detects output signals from the vector selector 180. The calibrator 105 controls each of the variable phase controllers 104 based on the detected output signals. The variable phase controllers 104 calibrate the phase of the inputted radio-frequency signals through a control by the calibrator 105.

Figure 2:
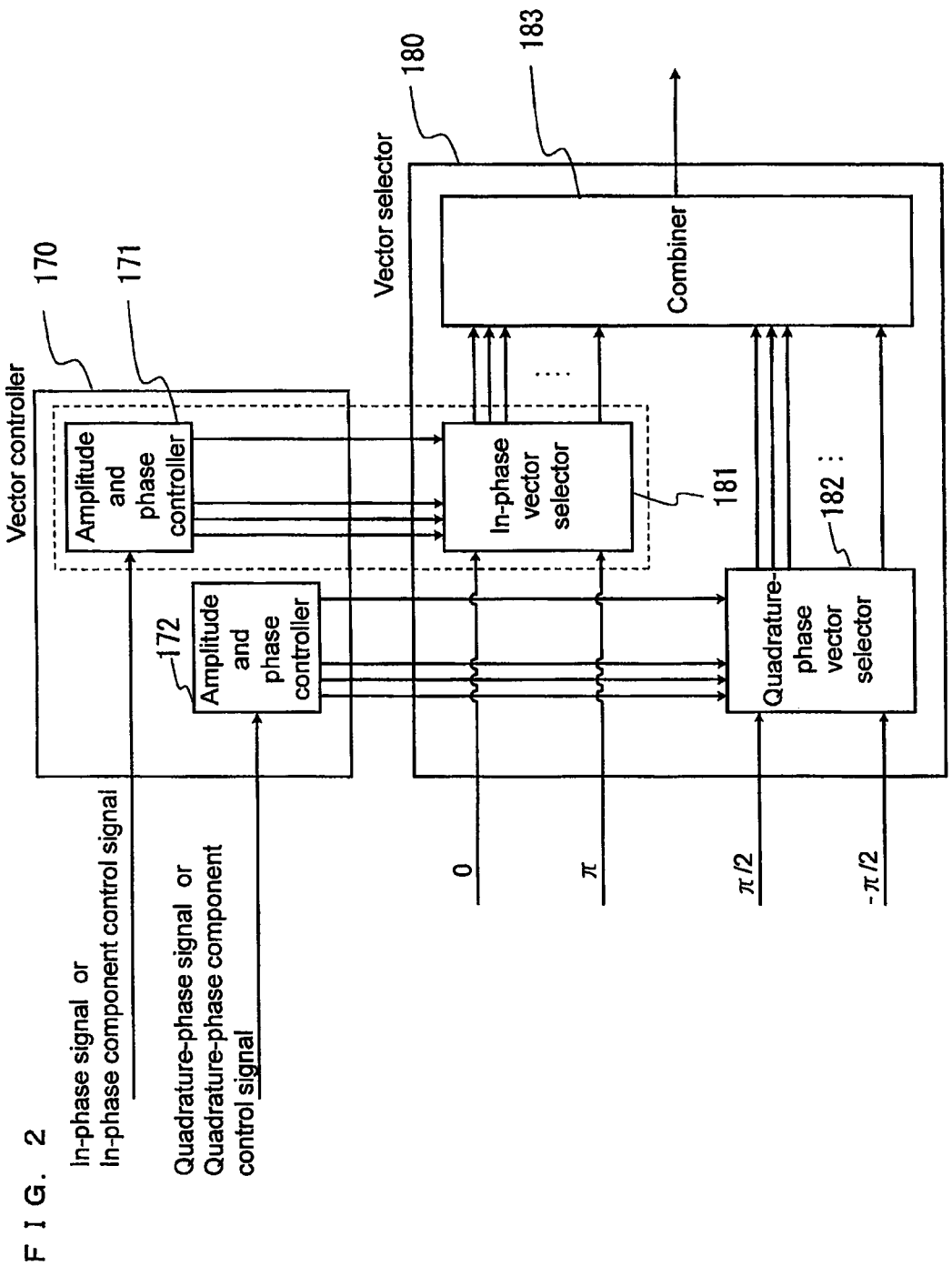
FIG. 2 shows a vector selector and a vector controller of the RFDAC 100 according to the first embodiment of the present invention.

In the following, detailed configuration of the RFDAC 100 will be described. FIG. 2 shows an internal configuration of the vector selector 180 and the vector controller 170 which are enclosed by a dashed line in FIG. 1. The vector controller 170 includes an in-phase signal amplitude and phase controller 171 and a quadrature-phase signal amplitude and phase controller 172. The vector selector 180 includes an in-phase signal vector selector 181, a quadrature-phase signal vector selector 182, and a combiner 183.

Figure 3:
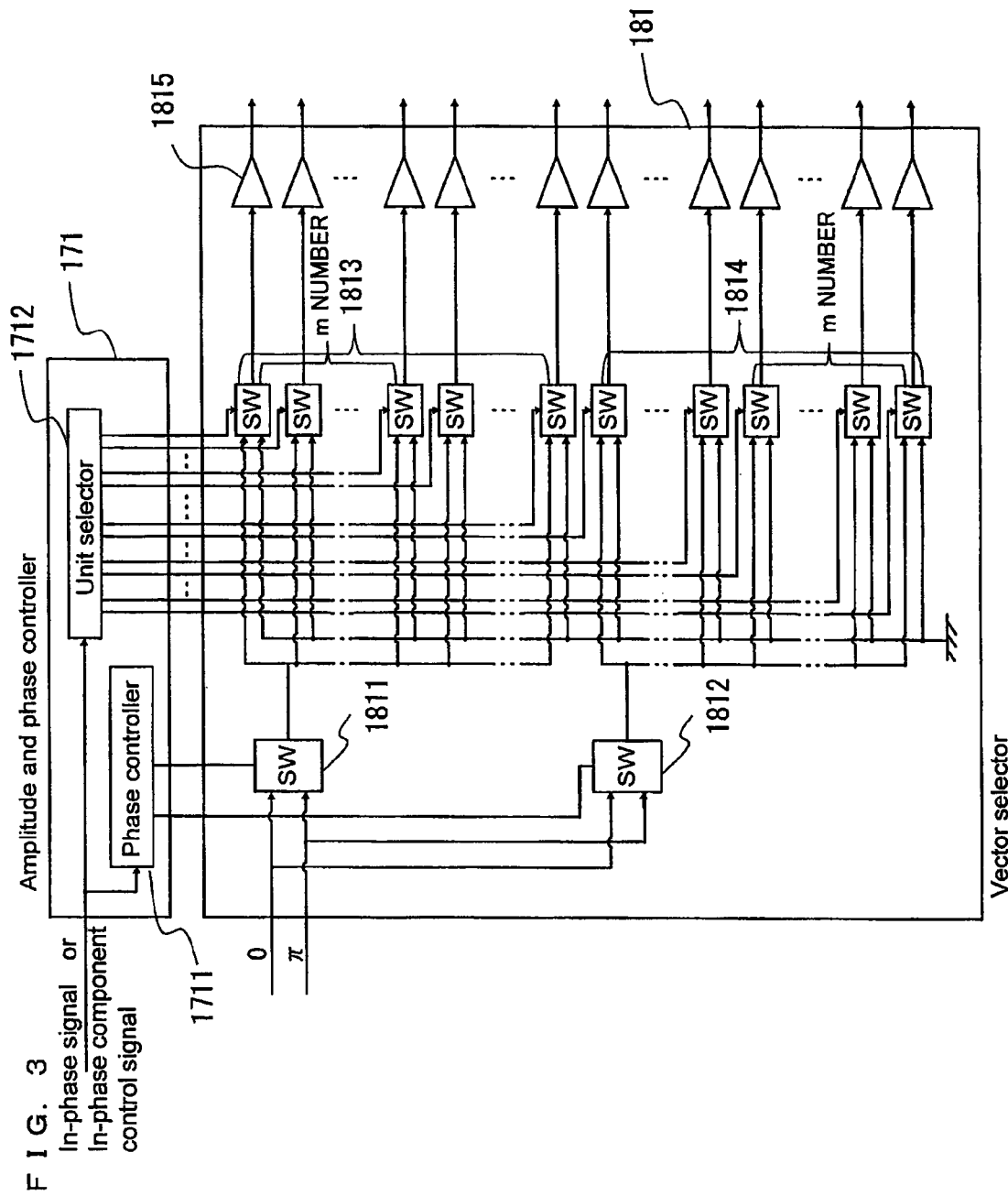
FIG. 3 shows one portion of the vector selector and the vector controller of the RFDAC 100 according to the first embodiment of the present invention.

FIG. 3 shows an internal configuration of the in-phase signal vector selector 181 and the in-phase signal amplitude and phase controller 171 which are enclosed by a dashed line in FIG. 2. The in-phase signal amplitude and phase controller 171 includes a phase controller 1711 and a unit selector 1712. The in-phase signal vector selector 181 includes first and second switches 1811, 1812, first and second switch banks 1813, 1814 each including N number (multiple) of switches, and multiple amplifiers (Power Amplifiers) 1815.

Diagrammatic representation of the internal configurations of the quadrature-phase signal amplitude and phase controller 172 and the quadrature-phase signal vector selector 182 are omitted since they are respectively similar to the internal configurations of the in-phase signal amplitude and phase controller 171 and the in-phase signal vector selector 181. The quadrature-phase signal amplitude and phase controller 172 includes a phase controller 1721 and a unit selector 1722. The quadrature-phase signal vector selector 182 includes third and fourth switches 1821, 1822, third and fourth switch banks 1823, 1824 each including multiple switches, and multiple amplifiers 1825. It should be noted that, when signal strengths of the radio-frequency signals are sufficiently large, the amplifiers 1815, 1825 can be omitted.

The in-phase signal is inputted to the in-phase signal amplitude and phase controller 171 when the multiplexer 102 selects the baseband signal, and the in-phase component control signal is inputted to the in-phase signal amplitude and phase controller 171 when the multiplexer 102 selects the test signal. Radio-frequency signals having phases of 0 and $\pi$ are inputted to the first switch 1811. In addition, radio-frequency signals having phases of 0 and $\pi$ are also inputted to the second switch 1812.

The phase controller 1711 controls the first and second switches 1811, 1812 so as to each select one of the radio-frequency signals having phases of 0 and $\pi$, based on the in-phase signal when the multiplexer 102 selects the baseband signal, or based on the in-phase component control signal when the multiplexer 102 selects the test signal.

The unit selector 1712 controls each of the switches of the first switch bank 1813, based on the in-phase signal when the multiplexer 102 selects the baseband signal, or based on the in-phase component control signal when the multiplexer 102 selects the test signal. It should be noted that, when the in-phase signal is being inputted, the number of switches to be turned "ON" is controlled in accordance with the amplitude of the in-phase signal. Each of the switches of the first switch bank 1813 outputs either an OFF state or the radio-frequency signal selected by the first switch 1811.

Furthermore, the unit selector 1712 controls each of the switches of the second switch bank 1814, based on the in-phase signal when the multiplexer 102 selects the baseband signal, or based on the in-phase component control signal when the multiplexer 102 selects the test signal. It should be noted that, when the in-phase signal is being inputted, the number of switches to be turned "ON" is controlled in accordance with the amplitude of the in-phase signal; and the level of the amplitude of the radio-frequency signal that has passed through the switches that have been turned "ON" is matched with the level of the amplitude of the in-phase signal. Each of the switches of the second switch bank 1814 outputs either an OFF state or the radio-frequency signal selected by the second switch 1812.

Outputs from the switches of the first and second switch banks 1813, 1814 are amplified by the respective amplifiers 1815. Signals amplified by the respective amplifiers 1815 are outputted through multiple paths of the in-phase signal vector selector 181. Thus, a group including the switches of the first and second switch banks 1813, 1814 and the amplifiers 1815 connected thereto form a single output unit.

When the multiplexer 102 selects the baseband signal, the quadrature-phase signal is inputted to the quadrature-phase signal amplitude and phase controller 172, and when the multiplexer 102 selects the test signal, the quadrature-phase component control signal is inputted to the quadrature-phase signal amplitude and phase controller 172. Radio-frequency signals with phases of $\pi/2$ and $-\pi/2$ are inputted to the third switch 1821, and radio-frequency signals with phases of $\pi/2$ and $-\pi/2$ are inputted to the fourth switch 1822. Based on the quadrature-phase signal or the quadrature-phase component control signal, the phase controller 1721 controls the third and fourth switches 1821, 1822 so as to select a radio-frequency signal with a phase of $\pi/2$ or $-\pi/2$.

The unit selector 1722 controls each of the switches of the third switch bank 1823, based on the quadrature-phase signal when the multiplexer 102 selects the baseband signal, or based on the quadrature-phase component control signal when the multiplexer 102 selects the test signal. It should be noted that, when the quadrature-phase signal is being inputted, the number of switches to be turned "ON" is controlled in accordance with the amplitude of the quadrature-phase signal. Each of the switches of the third switch bank 1823 outputs either an OFF state or the radio-frequency signal selected by the third switch 1821.

Furthermore, the unit selector 1722 controls each of the switches of the fourth switch bank 1824, based on the quadrature-phase signal when the multiplexer 102 selects the baseband signal, or based on the quadrature-phase component control signal when the multiplexer 102 selects the test signal. It should be noted that, when the quadrature-phase signal is being inputted, the number of switches to be turned "ON" is controlled in accordance with the amplitude of the quadrature-phase signal. Each of the switches of the fourth switch bank 1824 outputs either an OFF state or the radio-frequency signal selected by the fourth switch 1822.

Outputs from the switches of the third and fourth switch banks 1823, 1824 are amplified by the respective amplifiers 1825. Signals amplified by the respective amplifiers 1825 are outputted through multiple paths of the quadrature-phase signal vector selector 182. Thus, a group including the switches of the third and fourth switch banks 1823, 1824 and the amplifiers 1825 connected thereto form a single output unit.

The combiner 183 combines respective outputs of the in-phase signal vector selector 181 and the quadrature-phase signal vector selector 182, and outputs the combined result as an output of the RFDAC 100.

The operation of the RFDAC 100 will be described in each of the cases where the multiplexer 102 selects either of the baseband signal and the test signal.

[Selection of Test Signal: Calibration Operation]

In a state where phase calibration by the variable phase controllers 104 is turned "OFF," the RFDAC 100 calculates a calibration coefficient.

Figure 4:
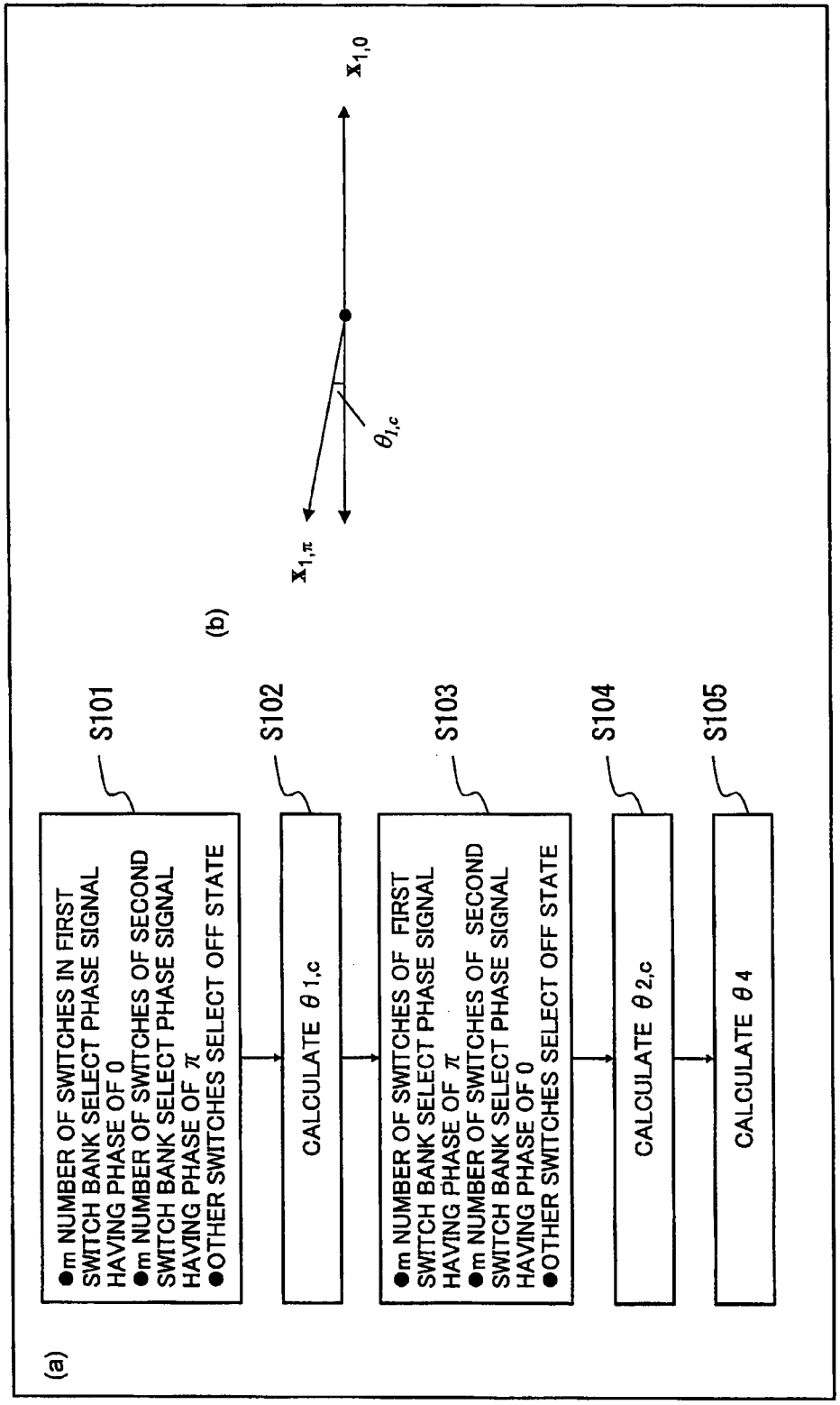
FIG. 4 shows processes executed by the RFDAC 100 according to the first embodiment of the present invention.

In FIG. 4(*a*), a calibration coefficient calculation process for an in-phase signal is shown. First, based on the in-phase component control signal, the phase controller 1711 controls the first and second switches 1811, 1812 so as to each select from radio-frequency signals having phases of 0 and $\pi$.

Based on the in-phase component control signal, the unit selector 1712 causes an arbitrary m number of the switches in the first switch bank 1813 to select a radio-frequency signal having a phase of 0, causes m number of switches in the second switch bank 1814 to select a radio-frequency signal having a phase of $\pi$, and causes other switches of the respective switch banks to select an OFF state (step S101).

It should be noted that, in order to calculate the calibration coefficient, it is not necessary to turn "ON" all the switches of the first switch bank 1813. For correcting a vector error for the in-phase signal vector selector 181 described later, it is necessary to use all the switches for calculating the calibration coefficient, and thereby all the switches are turned "ON."

The detector 106 detects the output signals from the vector selector 180. The sum of the vectors of the output signals from the m number of switches of the first switch bank 1813 is $x_{1,0}$, and the sum of the vectors of the output signals from the m number of switches of the second switch bank 1814 is $x_{1,\pi}$. These vectors are shown in FIG. 4(*b*).

Ideally, $x_{1,0}$ and $x_{1,\pi}$ have equal amplitude and differ in direction from each other by an angle of $\pi$. However, in reality, a difference between the directions of these vectors shifts from $\pi$ by $\theta_{1,c}$ in FIG. 4(*b*), due to a phase error of the radio-frequency signal outputted by the multi-phase radio-frequency signal generator 103, and due to differences in phase errors and amplitudes between the first and second switch banks 1813, 1814.

The calibrator 105 calculates the phase shift $\theta_{1,c}$ by using these vectors (step S102). Specifically, the value for the variable phase controllers 104 is changed to obtain a phase at which a size of a residual vector represented by the output signals becomes a minimum, and the plus-minus sign of that phase is changed to obtain $\theta_{1,c}$.

Next, phases inputted to the first and second switch banks 1813, 1814 are inversed.

The phase controller 1711 controls the first and second switches 1811, 1812 so as to each select from radio-frequency signals having phases of $\pi$ and 0. The unit selector 1712 causes m number of switches in the first switch bank 1813 to select a radio-frequency signal having a phase of $\pi$, causes m number of switches in the second switch bank 1814 to select a radio-frequency signal having a phase of 0, and causes other switches of the respective switch banks to select an OFF state (step S103).

The detector 106 detects the output signals from the vector selector 180. The sum of the vectors of the output signals from the m number of switches of the first switch bank 1813 is $x_{2,0}$, and the sum of the vectors of the output signals from the m number of switches of the second switch bank 1814 is $x_{2,\pi}$. A difference between the directions of these vectors shifts from π by $\theta_{2,c}$. The calibrator 105 calculates the phase shift $\theta_{2,c}$ by using these vectors (step S104).

By using the phase shift of $\theta_{1,c}$ and $\theta_{2,c}$, the calibrator 105 calculates a phase shift $\theta_4$ between the radio-frequency signals having phases of 0 and π outputted by the multi-phase radio-frequency signal generator 103 (step S105). The phase shift $\theta_4$ is a value obtained by subtracting, from the phase shift of $\theta_{1,c}$ and $\theta_{2,c}$, a phase shift attributed to differences in phase errors and amplitudes between the first and second switch banks 1813, 1814; and the value can be obtained from the following [Math 1] as $\theta_4 = -(\theta_{1,c} + \theta_{2,c})/2$.

That is, by switching switch banks with two radio-frequency signals, and by using a phase shift of radio-frequency signals before and after the switching, the phase shift attributed to an output path can be cancelled out, and thereby a phase error of the multi-phase radio-frequency signal generator 103 itself can be obtained.

[Math 1]

$$x_{1,0} = \sum_{k=1}^{m} u + e_k, \quad x_{1,\pi} = -e^{j\theta_4} \cdot \sum_{k=1}^{m} u + e_{N-k+1}$$

$$\theta_{1,c} = \arg(x_{1,0}) + \pi - \arg(x_{1,\pi})$$
$$= \arg\left(\sum_{k=1}^{m} u + e_k\right) + \pi - \left[\arg\left(\sum_{k=1}^{m} u + e_{N-k+1}\right) + \pi + \theta_4\right]$$
$$= \arg\left(\sum_{k=1}^{m} u + e_k\right) - \arg\left(\sum_{k=1}^{m} u + e_{N-k+1}\right) - \theta_4$$

$$x_{2,\pi} = e^{j\theta_4} \cdot \sum_{k=1}^{m} u + e_{N-k}, \quad x_{2,0} = \sum_{k=1}^{m} u + e_{N-k+1}$$

$$\theta_{2,c} = \arg(x_{2,0}) + \pi - \arg(x_{2,\pi})$$
$$= \arg\left(\sum_{k=1}^{m} u + e_{N-k+1}\right) + \pi - \arg\left(-e^{j\theta_4} \cdot \sum_{k=1}^{m} u + e_k\right)$$
$$= \arg\left(\sum_{k=1}^{m} u + e_{N-k+1}\right) + \pi - \left[\arg\left(\sum_{k=1}^{m} u + e_k\right) + \pi + \theta_4\right]$$
$$= \arg\left(\sum_{k=1}^{m} u + e_{N-k+1}\right) - \arg\left(\sum_{k=1}^{m} u + e_k\right) - \theta_4$$

where, $u$: Ideal unit vector $e_k$: Error vector of $k$th unit which includes a SW and a PA $$\therefore \theta_4 = -\frac{\theta_{1,c} + \theta_{2,c}}{2}$$

Furthermore, in the above described steps S101 and S103: the phase controller 1721 controls the third and fourth switches 1821, 1822 based on the quadrature-phase component control signal so as to each select from radio-frequency signals having phases of π/2 and −π/2; and, by using the radio-frequency signals having phases of π/2 and −π/2 instead of the radio-frequency signals having phases of 0 and π, the calibrator 105 calculates, as a calibration coefficient, a phase shift $\theta_6$ between the radio-frequency signals having phase of π/2 and −π/2 outputted by the multi-phase radio-frequency signal generator 103.

[Selection of Baseband Signal: Data Transmission Operation]

An operation that is conducted when the baseband signal is inputted after the calibration is performed using the test signal will be described.

The RFDAC 100 is operated for outputting a transmission signal. The phase of the radio-frequency signal inputted to the vector selector 180 is calibrated by the variable phase controllers 104.

That is, the calibrator 105 calibrates an error of $+\theta_4$ by conducting a $-\theta_4$ rotation, by using $\theta_4$ obtained by having the variable phase controllers 104, which is connected to each of the outputs of the radio-frequency signals having phases of 0 and π from the multi-phase radio-frequency signal generator 103, calibrate a signal having a π phase.

Furthermore, an error of $+\theta_6$ is calibrated by conducting a $-\theta_6$ rotation, by using $\theta_6$ obtained by having a calibration operation conducted on a signal having a −π/2 phase by the variable phase controllers 104, which is connected to each of the outputs of the radio-frequency signal having phases of π/2 and −π/2 from the multi-phase radio-frequency signal generator 103.

When the present in-phase signal of the inputted baseband signal shows a non-negative value, the phase controller 1711 of the in-phase signal amplitude and phase controller 171 causes both the first and second switches 1811, 1812 to select a radio-frequency signal having a phase of 0.

When the present in-phase signal indicates a negative value, the phase controller 1711 causes both the first and second switches 1811, 1812 to select a radio-frequency signal having a phase of π.

In accordance with the size of the amplitude of the in-phase signal, the unit selector 1712 turns "ON" one portion of the switches of the first and second switch banks 1813, 1814, and turns "OFF" the remainder of the switches. In one example, the number of switches that are turned "ON" is proportional to the size of the amplitude of the in-phase signal.

When the present quadrature-phase signal of the inputted baseband signal indicates a non-negative value, the phase controller 1721 of the quadrature-phase signal amplitude and phase controller 172 causes both the third and fourth switches 1821, 1822 to select a radio-frequency signal having a phase of π/2.

Furthermore, when the present quadrature-phase signal indicates a negative value, the phase controller 1721 causes both the third and fourth switches 1821, 1822 to select a radio-frequency signal having a phase of −π/2.

In accordance with the size of the amplitude of the quadrature-phase signal, the unit selector 1722 turns "ON" one portion of the switches of the third and fourth switch banks 1823, 1824, and turns "OFF" the remainder of the switches.

Since the baseband signal is outputted from the RFDAC after the calibration is performed using the test signal, spectrum regrowth and modulation accuracy degradation can be suppressed.

As described above, the RFDAC 100 can set, to π, the phase difference between the radio-frequency signals having phases of 0 and π of the multi-phase radio-frequency signal generator 103, and can set, to π, the phase difference between the radio-frequency signal having phases of π/2 and −π/2. Therefore, PSD (power spectral density), ACLR (adjacent channel leakage power ratio), and EVM (error vector magnitude) can be improved, and high precision output signals can be outputted.

In addition, phase errors of the multi-phase radio-frequency signal generator can be reduced, and amplitude errors and phase errors between the multiple switch banks can be reduced.

[Second Embodiment]

A configuration of an RFDAC 200 according to the present embodiment is obtained by changing the internal configurations of the in-phase signal amplitude and phase controller 171, the quadrature-phase signal amplitude and phase controller 172, the in-phase signal vector selector 181, and the quadrature-phase signal vector selector 182 in the RFDAC 100 according to the first embodiment.

More specifically, the in-phase signal vector selector 181 does not include the first switch 1811 and the second switch 1812, and the quadrature-phase signal vector selector 182 does not include the third switch 1821 and the fourth switch 1822. In addition, the amplitude and phase controller 171 does not include the phase controller 1711.

As a result, each of the switches in the first, second, third, and fourth switch banks selects either allowing passage of a phase of π, allowing passage of a phase of 0, or not allowing passage of a radio-frequency signal.

Figure 5:
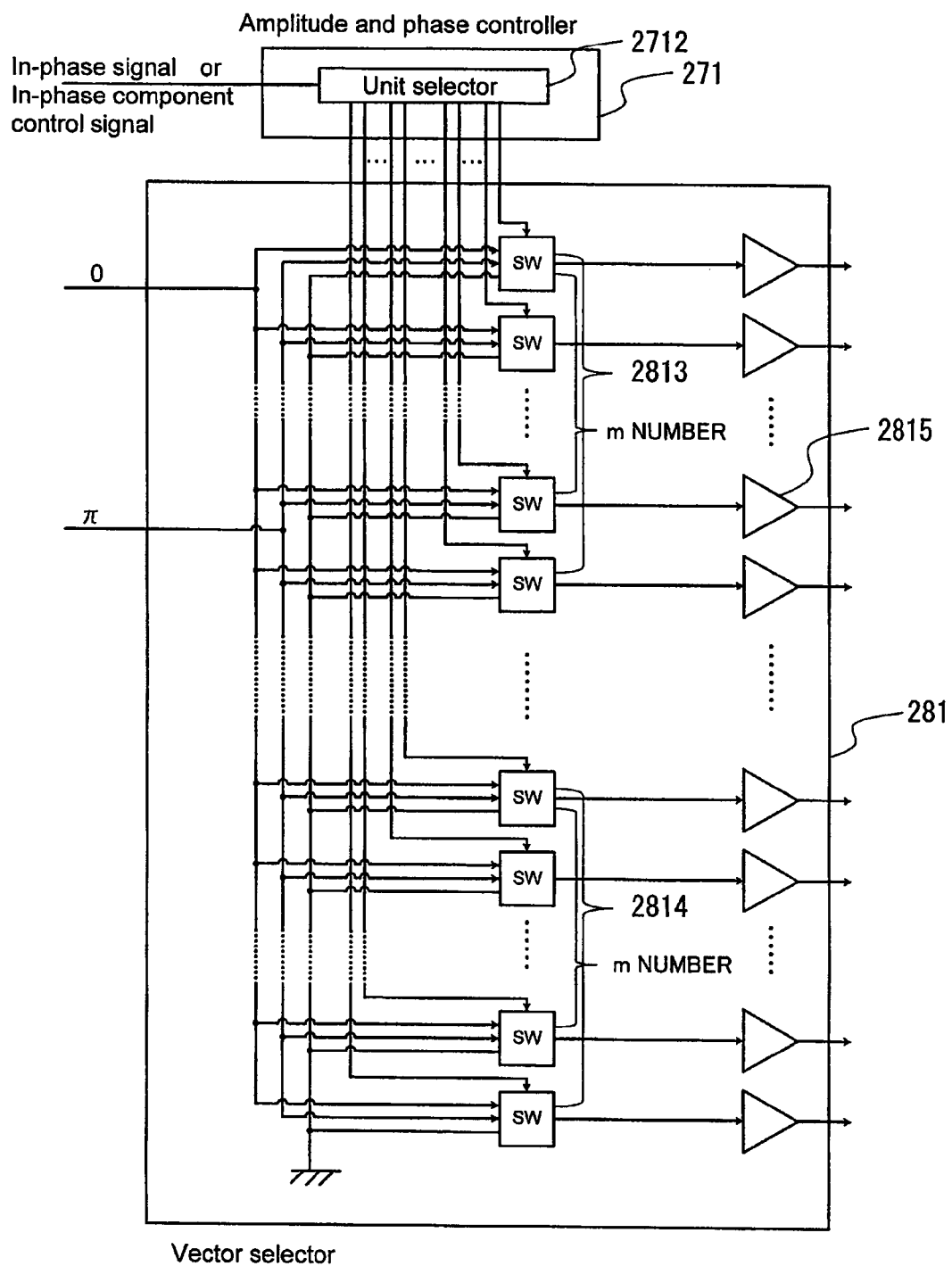
FIG. 5 shows one portion of a vector selector and a vector controller of an RFDAC 200 according to a second embodiment of the present invention.

FIG. 5 shows an internal configuration of an in-phase signal amplitude and phase controller 271 and an in-phase signal vector selector 281 of the RFDAC 200.

The in-phase signal amplitude and phase controller 271 includes a unit selector 2712. The in-phase signal vector selector 281 includes first and second switch banks 2813, 2814 each including multiple switches, and multiple amplifiers (Power Amplifiers) 2815.

Diagrammatic representation of the internal configurations of the quadrature-phase signal amplitude and phase controller 172 and the quadrature-phase signal vector selector 182 are omitted since they are respectively similar to the internal configurations of the in-phase signal amplitude and phase controller 171 and the in-phase signal vector selector 181. A quadrature-phase signal amplitude and phase controller 272 includes a phase controller 2721. A quadrature-phase signal vector selector 282 includes third and fourth switch banks 2823, 2824 each including multiple switches, and the multiple amplifiers 1825. It should be noted that, when signal strengths of the radio-frequency signals are sufficiently large, the amplifiers 2815, 2825 can be omitted.

[Selection of Test Signal: Calibration Operation]

In a state where phase calibration by the variable phase controllers 104 is turned "OFF," the RFDAC 100 calculates a calibration coefficient.

First, operations of the in-phase signal amplitude and phase controller 271 and the in-phase signal vector selector 281 will be described.

Based on the in-phase component control signal, the unit selector 2712 in the in-phase signal amplitude and phase controller 271 causes an arbitrary m number of switches in the first switch bank 2813 to selected a radio-frequency signal having either a phase of 0 or a phase of π, causes an arbitrary m number of switches in the second switch bank 2814 to select a radio-frequency signal having a phase that is different from that of the first switch bank 2813, and causes the remainder of the switches of each of the switch banks to select an OFF state.

Next, operations of the quadrature-phase signal amplitude and phase controller 272 and the quadrature-phase signal vector selector 282 will be described. It should be noted that, drawings for the quadrature-phase signal amplitude and phase controller 272 and the quadrature-phase signal vector selector 282 are omitted since they are similar to the in-phase signal amplitude and phase controller 271 and the in-phase signal vector selector 281.

Based on the quadrature-phase component control signal, a unit selector 2722 included in the quadrature-phase signal amplitude and phase controller 272 cause an arbitrary m number of switches in the third switch bank 2833 to select a radio-frequency signal having a phase of 0 or a phase of π, causes an arbitrary m number of switches in a fourth switch bank 2824 to select a radio-frequency signal having a phase different from that of the second switch bank 2823, and causes the remainder of the switches of each of the switch banks to select an OFF state.

It should be noted that, the subsequent operations for obtaining the calibration coefficient are similar to those of the first embodiment, and thereby descriptions thereof are omitted here.

[Selection of Baseband Signal: Data Transmission Operation]

An operation that is conducted when the baseband signal is inputted after the calibration is performed using the test signal will be described.

The in-phase signal is inputted to the in-phase signal amplitude and phase controller 271. Radio-frequency signals having phases of 0 and π are inputted to the respective switches of the first and second switch banks 2813, 2814. By using the in-phase signal, the unit selector 2712 controls each of the switches of the first and second switch banks 2813, 2814 so as to select either OFF state or one of the radio-frequency signals having phases of 0 and π.

Outputs from the switches of the first and second switch banks 2813, 2814 are amplified by the respective amplifiers 2815. Signals amplified by the respective amplifiers 2815 are outputted through multiple paths of the in-phase signal vector selector 281. Thus, a group including the switches of the first and second switch banks 2813, 2814 and the amplifiers 2815 connected thereto form a single output unit.

The quadrature-phase signal is inputted to the quadrature-phase signal amplitude and phase controller 272. Radio-frequency signals having phases of π/2 and −π/2 are inputted to the respective switches of the third and fourth switch banks 2823, 2824. By using the quadrature-phase signal, the unit selector 2722 controls each of the switches of the third and fourth switch banks 2823, 2824 so as to select either an OFF state or one of the radio-frequency signals having phases of π/2 and −π/2.

Outputs from the switches of the third and fourth switch banks 2823, 2824 are amplified by the respective amplifiers 2825. Signals amplified by the respective amplifiers 2825 are outputted through multiple paths of the quadrature-phase signal vector selector 282. Thus, a group including the switches of the third and fourth switch banks 2823, 2824, and the amplifiers 2825 connected thereto form a single output unit.

It should be noted that the operations of the variable phase controllers 104 and the calibrator 105 are similar to those of the first embodiment, thereby descriptions thereof are omitted here.

With the configuration described above, similarly to the RFDAC 100 according to the first embodiment, the RFDAC 200 can set, to π, the phase difference between the radio-frequency signals having phases of 0 and π of the multi-phase radio-frequency signal generator 103, and can set, to π, the phase difference between the radio-frequency signals having phase of π/2 and −π/2. Therefore, PSD (power spectral density), ACLR (adjacent channel leakage power ratio), and EVM (error vector magnitude), can be improved, and high precision output signals can be outputted.

[Third Embodiment]

A configuration of an RFDAC 300 according to the present embodiment is obtained by changing the internal configurations of the in-phase signal amplitude and phase controller 171, the quadrature-phase signal amplitude and phase controller 172, the in-phase signal vector selector 181, and the quadrature-phase signal vector selector 182 in the RFDAC 100 according to the first embodiment.

Thus, although the first embodiment is a configuration for digitally control the number of switches of the switch banks, the present embodiment is a configuration for controlling, in an analog manner, amplitude inputted to an amplifier.

Figure 6:
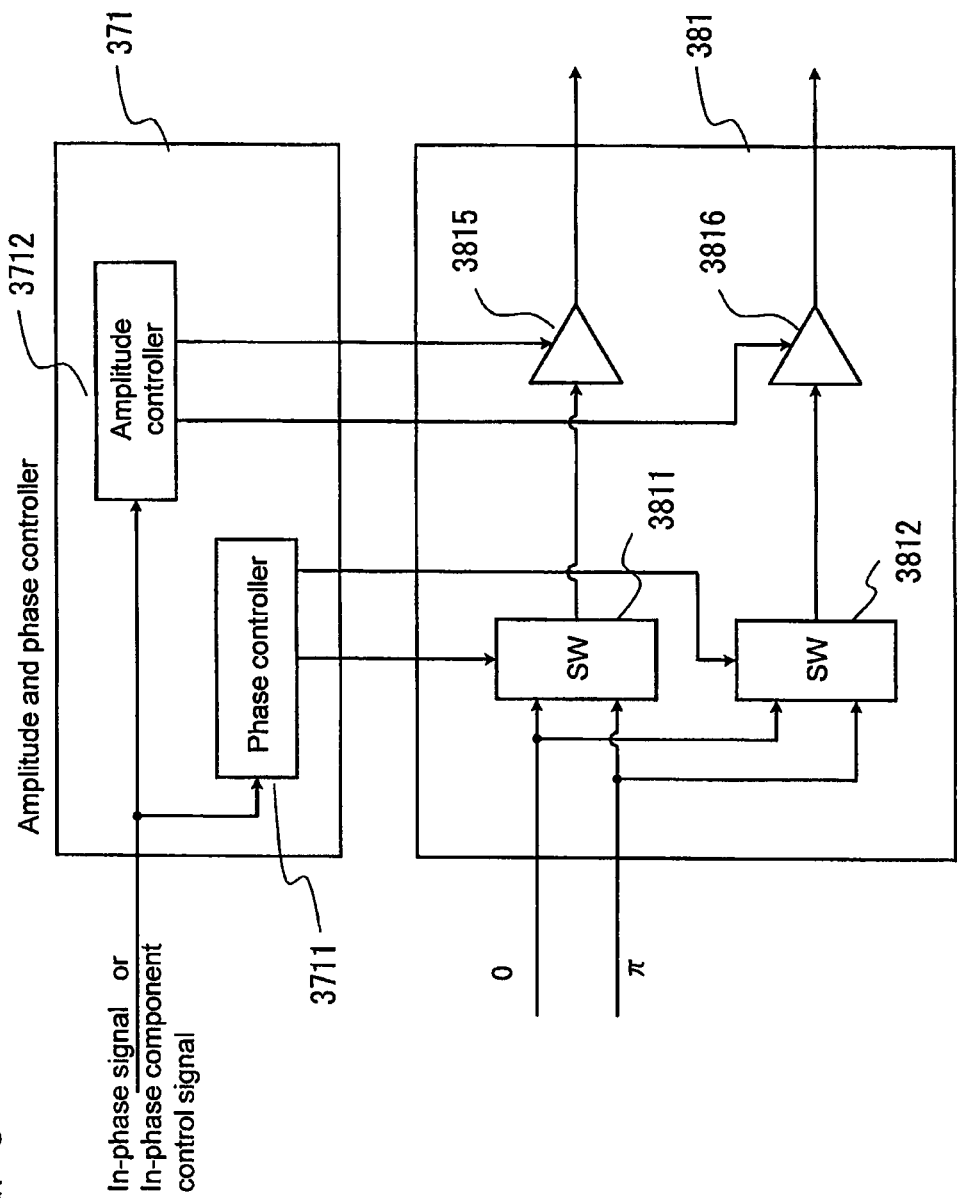
FIG. 6 shows one portion of a vector selector and a vector controller of an RFDAC 300 according to a third embodiment of the present invention.

FIG. 6 shows an internal configuration of an in-phase signal amplitude and phase controller 371 and an in-phase signal vector selector 381 of the RFDAC 300.

The in-phase signal amplitude and phase controller 371 includes a phase controller 3711 and an amplitude controller 3712. The in-phase signal vector selector 381 includes first and second switches 3811, 3812, and first and second amplifiers 3815, 3816.

Diagrammatic representation of internal configurations of a quadrature-phase signal amplitude and phase controller 372 and a quadrature-phase signal vector selector 382 are omitted since they are respectively similar to the internal configurations of the in-phase signal amplitude and phase controller 371 and the in-phase signal vector selector 381. The quadrature-phase signal amplitude and phase controller 372 includes a phase controller 3721 and an amplitude controller 3722. The quadrature-phase signal vector selector 382 includes third and fourth switches 3821, 3822, and third and fourth amplifiers 3825, 3826.

[Selection of Test Signal: Calibration Operation]

In a state where phase calibration by the variable phase controllers 104 is turned "OFF," the RFDAC 100 calculates a calibration coefficient.

In the first embodiment, the amplitudes of the signals inputted to the amplifiers 1815 are changed based on the number of switches of the switch banks 1813, 1814 selected by the unit selector 1712, and the amplification factor of the amplifiers 1815 is fixed. However, the present embodiment is different in that the amplification factor of the amplifiers 3815, 3816 is set by the amplitude controller 3712 to which the in-phase component control signal in inputted.

Furthermore, in the first embodiment, the amplitudes of the signals inputted to the amplifiers 1825 are changed based on the number of switches of the switch banks 1823, 1824 selected by the unit selector 1722, and the amplification factor of the amplifiers 1825 is fixed. However, the present embodiment is different in that the amplification factor of the amplifiers 3825, 3826 is set by the amplitude controller 3722 to which the quadrature-phase component control signal is inputted.

The subsequent operations for obtaining the calibration coefficient are similar to those of the first embodiment, and thereby descriptions thereof are omitted here.

[Selection of Baseband Signal: Data Transmission Operation]

An operation that is conducted when the baseband signal is inputted after the calibration is performed using the test signal will be described.

The in-phase signal is inputted to the in-phase signal amplitude and phase controller 371. Radio-frequency signals having phases of 0 and π are inputted to the respective switches of the first and second switches 3811, 3812. Based on the in-phase signal, the phase controller 3711 controls the first and second switches 3811, 3812 so as to each select one of the radio-frequency signal having phases of 0 and π.

The amplitude controller 3712 controls the first and second amplifiers 3815, 3816 so as to each amplify the respective radio-frequency signals selected by the first and second switches 3811, 3812, by using an amplification factor that depends on the amplitude of the in-phase signal.

Each of the amplified radio-frequency signals is outputted through multiple paths of the in-phase signal vector selector 381. Thus, a group including the switches of the first and second switches 3811, 3812 and the amplifiers 3815, 3816 connected thereto form a single output unit.

The quadrature-phase signal is inputted to the quadrature-phase signal amplitude and phase controller 372. Radio-frequency signals having phases of $\pi/2$ and $-\pi/2$ are inputted to the respective switches of the third and fourth switches 3821, 3822. Based on the quadrature-phase signal, the phase controller 3721 controls the third and fourth switches 3821, 3822 so as to each select one of the radio-frequency signals having phases of $\pi/2$ and $-\pi/2$.

The amplitude controller 3722 controls the third and fourth amplifiers 3825, 3826 so as to each amplify the respective radio-frequency signals selected by the third and fourth switches 3821, 3822, by using an amplification factor that depends on the amplitude of the quadrature-phase signal.

Each of the amplified radio-frequency signals is outputted through multiple paths of the quadrature-phase signal vector selector 382. Thus, a group including the switches of the third and fourth switches 3821, 3822 and the amplifiers 3825, 3826 connected thereto form a single output unit.

It should be noted that the operations of the variable phase controllers 104 and the calibrator 105 are similar to those in the first embodiment, and thereby descriptions thereof are omitted.

With the configuration described above, the RFDAC 300 can detect a shift in phases between two amplifiers in the respective vector selectors, and can calibrate a phase distortion. Therefore, high precision output signals can be outputted.

[Fourth Embodiment]

Figure 7:
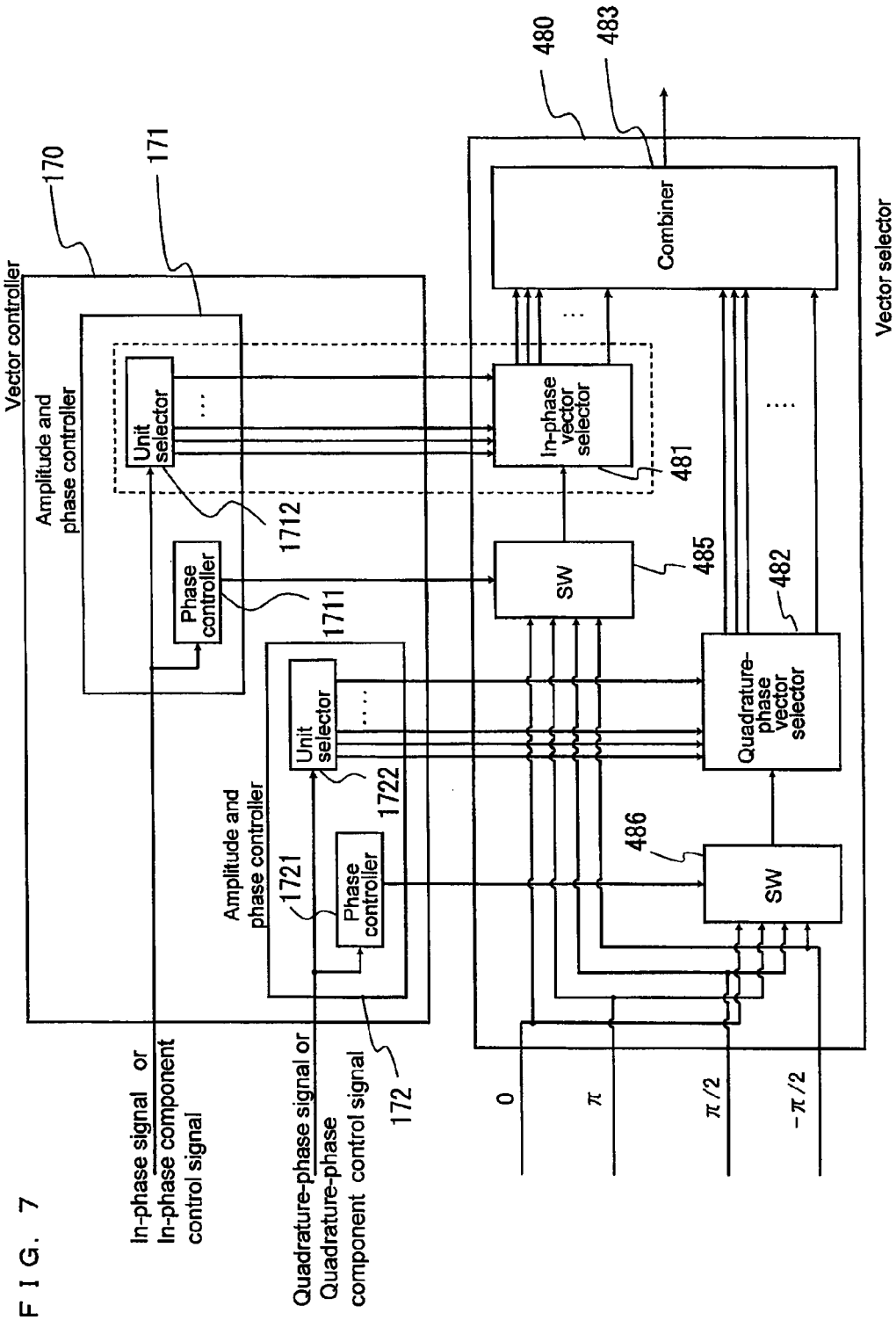
FIG. 7 shows a vector selector and a vector controller of an RFDAC 400 according to a fourth embodiment of the present invention.

A configuration of an RFDAC 400 according to the present embodiment is obtained by changing the internal configuration of the vector selector 180 in the RFDAC 100 according to the first embodiment. FIG. 7 shows an internal configuration of the vector controller 170 and a vector selector 480 of the RFDAC 400.

The vector selector 480 includes first and second switches 485, 486, an in-phase signal vector selector 481, a quadrature-phase signal vector selector 482, and a combiner 483.

Figure 8:
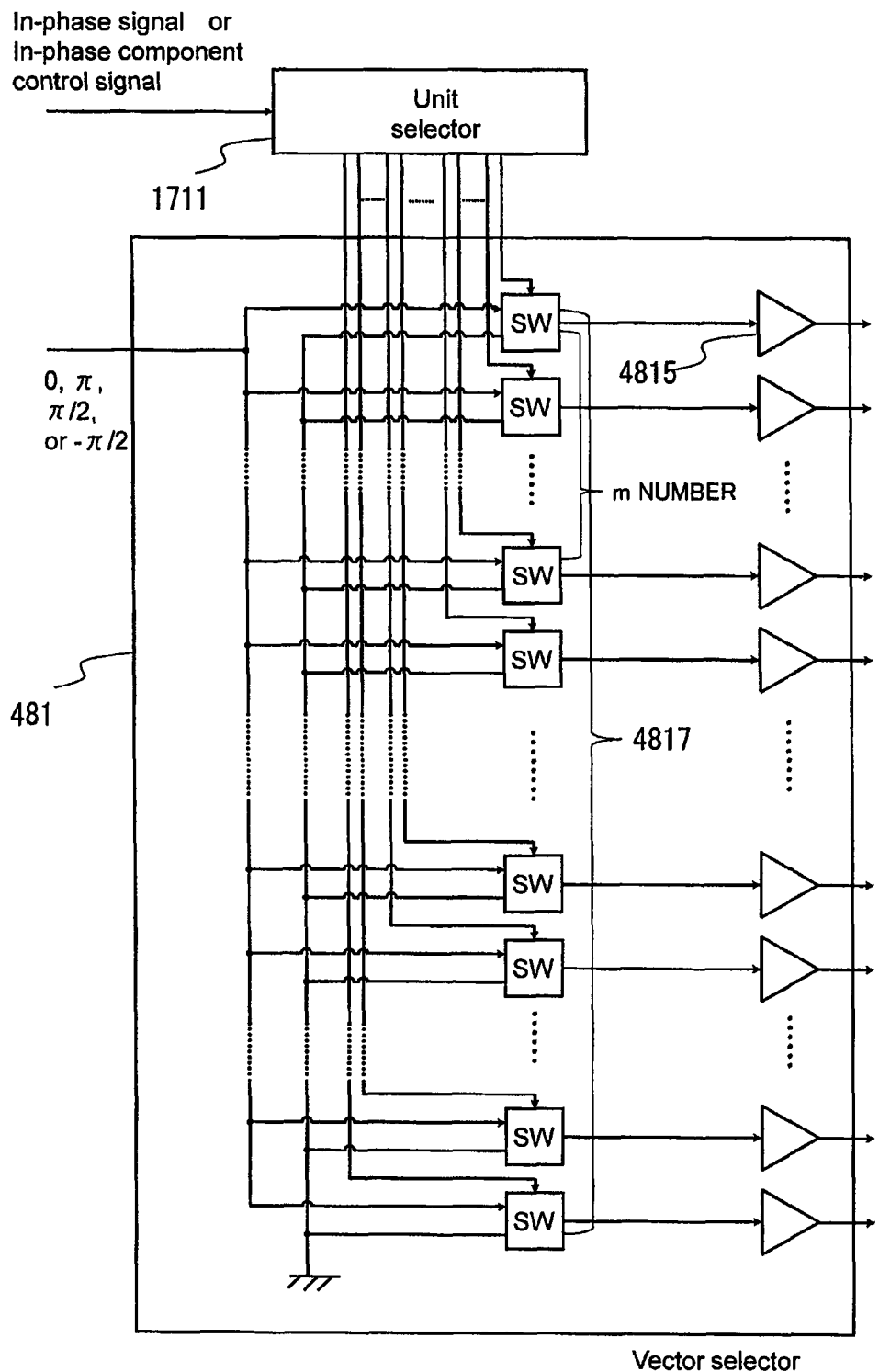
FIG. 8 shows one portion of a vector selector and a vector controller of the RFDAC 400 according to the fourth embodiment of the present invention.

FIG. 8 shows an internal configuration of the in-phase signal vector selector 481 and the unit selector 1712 which are enclosed by a dashed line in FIG. 7. The in-phase signal vector selector 481 includes a first switch bank 4817 including multiple switches, and multiple amplifiers 4815.

Diagrammatic representation of internal configurations of the quadrature-phase signal vector selector 482 is omitted since it is similar to the internal configuration of the in-phase signal vector selector 481. The quadrature-phase signal vector selector 482 includes a second switch bank 4827 including multiple switches, and multiple amplifiers 4825.

The first and second switches 485, 486 of the vector selector 480 are respectively controlled by the phase controller 1711 of the in-phase signal amplitude and phase controller 171 and the phase controller 1721 of the quadrature-phase signal amplitude and phase controller 172. Radio-frequency signals having phases of 0, $\pi$, $\pi/2$, and $-\pi/2$ are inputted to the first switch 485. The phase controller 1711 controls the first switch 485 so as to select one of these radio-frequency signals.

The unit selector 1712 controls each of the switches of the first switch bank 4817 of the in-phase signal vector selector 481 so as to select either an OFF state or the radio-frequency signal selected by the first switch 485. Outputs from the switches of the first switch bank 4817 are amplified by the respective amplifiers 4815. Signals amplified by the respective amplifiers 4815 are outputted through multiple paths of the in-phase signal vector selector 481. Thus, a group including the switches of the first switch bank 4817 and the amplifiers 4815 connected thereto form a single output unit, i.e., a path.

Radio-frequency signals having phases of 0, $\pi$, $\pi/2$, and $-\pi/2$ are inputted to the second switch 486. The second switch 486 is controlled by the phase controller 1721, and selects one of the inputted radio-frequency signals. The unit selector 1722 controls each of the switches of the second switch bank 4827 of the quadrature-phase signal vector selector 482. Each of the switches of the second switch bank 4827 selects either an OFF state or the radio-frequency signal selected by the second switch 486.

Outputs from the switches of the second switch bank 4827 are amplified by the respective amplifiers 4825. Signals amplified by the respective amplifiers 4825 are outputted through multiple paths of the quadrature-phase signal vector selector 482. Thus, a group including the switches of the second switch bank 4827 and the amplifiers 4825 connected thereto form a single output unit, i.e., a path.

The operation of the RFDAC 100 will be described in accordance with which of the baseband signal and the test signal has been selected by the multiplexer 102.

[Selection of Test Signal: Calibration Operation]

The phase controller 1711 of the in-phase signal amplitude and phase controller 171 controls the first switch 485 so as to select a radio-frequency signal having a phase of 0. The phase controller 1721 of the quadrature-phase signal amplitude and phase controller 172 controls the second switch 486 so as to select a radio-frequency signal having a phase of $\pi$. The unit selector 1712 of the in-phase signal amplitude and phase controller 171 causes m number of switches in the first switch bank 4817 to select a radio-frequency signal having a phase of 0, causes m number of switches of the second switch bank 4827 to select a radio-frequency signal having a phase of $\pi$, and causes the other switches to select an OFF state.

With a method similar to that of the first embodiment, the calibrator 105 calculates a phase shift $\theta_{1,c}$ based an output from the combiner 483. Next, the phase controller 1711 of the in-phase signal amplitude and phase controller 171 controls the first switch 485 so as to select a radio-frequency signal having a phase of $\pi$. The phase controller 1721 of the quadrature-phase signal amplitude and phase controller 172 controls the second switch 486 so as to select a radio-frequency signal having a phase of 0.

The unit selector 1712 of the in-phase signal amplitude and phase controller 171 causes m number of switches in the first switch bank 4817 to select a radio-frequency signal having a phase of $\pi$, causes m number of switches in the second switch bank 4827 to select a radio-frequency signal having a phase of 0, and causes the other switches to select an OFF state.

With a method similar to that of the first embodiment, the calibrator 105 calculates a phase shift $\theta_{2,c}$ based on the output from the combiner 483. With this, $\theta_4$ is obtained similarly to the first embodiment.

Next, the respective switches are caused to select from radio-frequency signals having phases of $\pi/2$ and $-\pi/2$, and $\theta_6$ is obtained by a similar method.

Next, by using the obtained $\theta_4$ and $\theta_6$, the phase error in the multi-phase radio-frequency signal generator 103 can be calibrated similarly to the first embodiment.

It should be noted that the operation for data transmission when the baseband signal is selected is similar to that of the first embodiment, and thereby description thereof is omitted.

With the configuration described above, similarly to the RFDAC 100 according to the first embodiment, the RFDAC 400 can set, to $\pi$, the phase difference between the radio-frequency signals having phases of 0 and $\pi$ of the multi-phase radio-frequency signal generator 103, and can set, to $\pi$, the phase difference between the radio-frequency signals having phases of $\pi/2$ and $-\pi/2$. Therefore, PSD (power spectral density), ACLR (adjacent channel leakage power ratio), and EVM (error vector magnitude) can be improved, and high precision output signals can be outputted.

[Fifth Embodiment]

Figure 9:
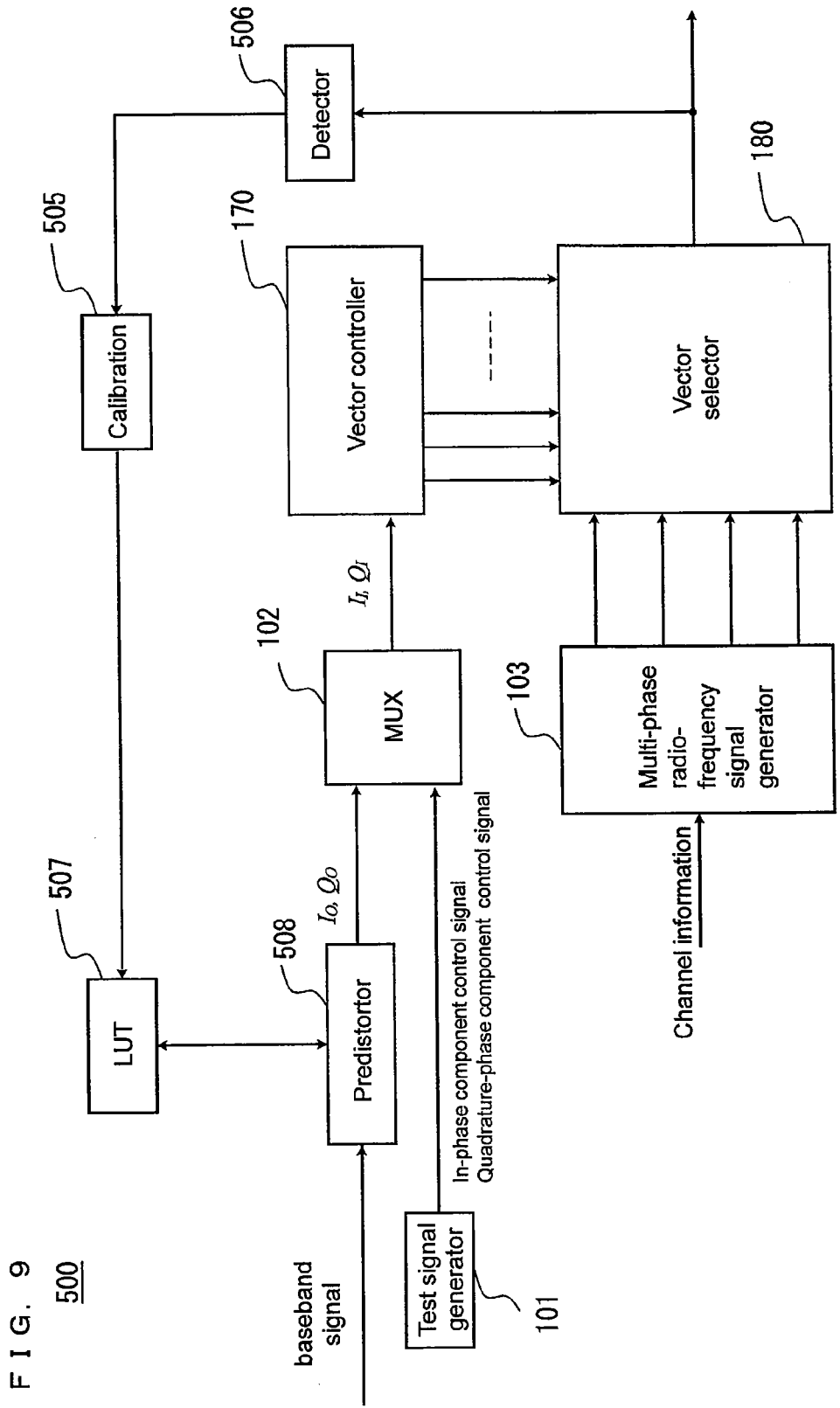
FIG. 9 shows an RFDAC 500 according to a fifth embodiment of the present invention.

FIG. 9 shows a general outline of an RFDAC 500 according to the present embodiment. The RFDAC 500 according to the present embodiment includes a predistorter 508 and an LUT (look-up table) 507 instead of including the variable phase controllers 104 of the RFDAC 100 according to the first embodiment. Another difference is that the phase distortion of the output signals from the multiplexer 102 is calibrated by a detector 506, a calibrator 505, and the LUT 507; whereas, in the RFDAC 100, the phase distortion of the output signals from the multi-phase radio-frequency signal generator 103 is calibrated.

Figure 10:
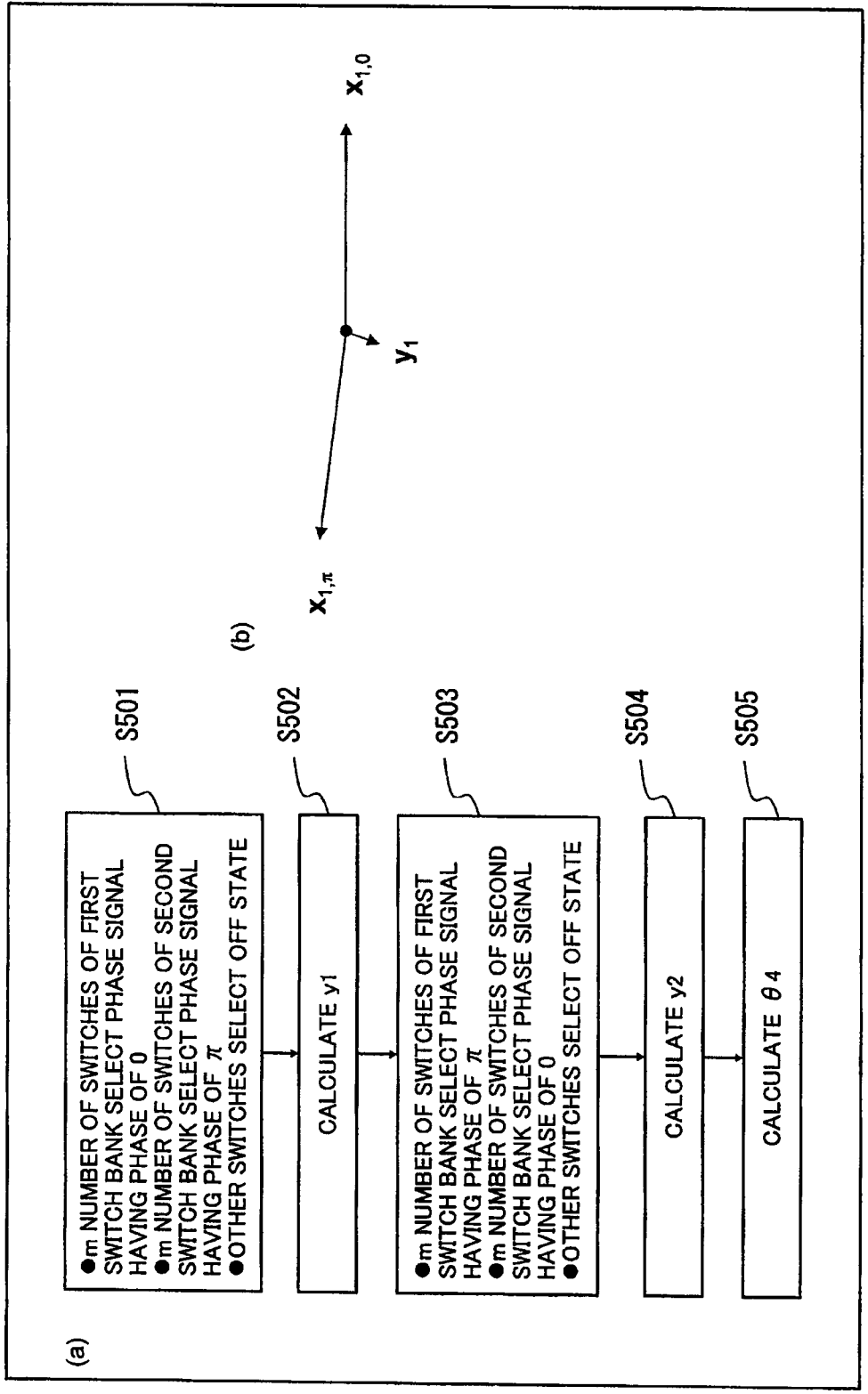
FIG. 10 shows processes executed by the RFDAC 500 according to the fifth embodiment of the present invention.

An operation of calibrating the phase distortion in the present embodiment will be described. When the multiplexer 102 selects the test signal and in a state where phase calibration is turned "OFF," the RFDAC 500 calculates the calibration coefficient. FIG. 10(*a*) shows processes for calculating the calibration coefficient using the radio-frequency signals having phases of 0 and $\pi$. First, similarly to step S101 in the first embodiment, m number of switches in the first switch bank 1813 select a radio-frequency signal having a phase of 0, m number of switches in the second switch bank 1814 select a radio-frequency signal having a phase of $\pi$, and other switches of the respective switch banks select an OFF state (step S501).

The detector 506 detects the output signals from the vector selector 180. FIG. 10(*b*) shows the sum $x_{1,0}$ of the vector of the output signals from the m number of switches of the first switch bank 1813, and the sum $x_{1,\pi}$ of the vector of the output signals from the m number switches of the second switch bank 1814.

The sum of $x_{1,0}$ and $x_{1,\pi}$ is ideally a null vector, but in reality, the sum of $x_{1,0}$ and $x_{1,\pi}$ is not a null vector due to a phase error of the radio-frequency signal outputted by the multi-phase radio-frequency signal generator 103 and due to differences in phase errors and amplitudes between the first and second switch banks 1813, 1814.

The calibrator 505 calculates a vector $y_1 = -(x_{1,0} + x_{1,\pi})$. Alternatively, instead of calculating $-(x_{1,0} + x_{1,\pi})$, the calibrator 505 may further refer to a radio-frequency signal $x_{\pi/2}$ that has a phase of $\pi/2$ and is outputted by the multi-phase radio-frequency signal generator 103, may obtain a coefficient c1 which is a real number that minimizes the size of a vector $(x_{1,0} + x_{1,\pi} + c1 \cdot x_{\pi/2})$, and may approximately determine the vector $y_1$ as $c1 \cdot x_{\pi/2}$.

Furthermore although not diagrammatically represented, the vector $y_1$ may be calculated by, for example, in FIG. 2, adding a phase of $\pi/2$ outputted by the multi-phase radio-frequency signal generator 103 with phase 0 and phase $\pi$, inputting the resulting phase to the in-phase vector selector 181, and, in FIG. 3, inputting it to m number of switches that are not in an "ON" state and that are included in the first switch bank 1813 and the second switch bank 1814.

Alternatively, when approximately determining the vector $y_1$, depending on the direction of the vector $y_1$, the calibrator 505 uses a radio-frequency signal $x_{-\pi/2}$ having a phase of $-\pi/2$ instead of the radio-frequency signal $x_{\pi/2}$ having a phase of $\pi/2$ (step S502).

Here, for example, the radio-frequency signals having phases of $\pi/2$ or $-\pi/2$ can be outputted to the detector 506 at an arbitrary size by having the vector controller 170 select arbitrary the switches of the vector selector 180, and the detector 506 and the calibrator 505 can detect the vector $(x_{1,0}+x_{1,\pi}+c1\cdot x_{\pi/2})$.

Next, similarly to step S103 in the first embodiment, m number of switches in the first switch bank 1813 select a radio-frequency signal having a phase of π, m number of switches in the second switch bank 1814 select a radio-frequency signal having a phase of 0, and the other switches of the respective switch banks select an OFF state (step S503).

The detector 506 detects the output signals from the vector selector 180. The sum of the vectors of the output signals from the m number of switches of the first switch bank 1813 is $x_{2,0}$, and the sum of the vectors of the output signals from the m number switches of the second switch bank 1814 is $x_{2,\pi}$.

The calibrator 505 calculates a vector $y_2 = -(x_{2,0}+x_{2,\pi})$ based on the vector detected by the detector. Alternatively, instead of calculating $-(x_{2,0}+x_{2,\pi})$, the calibrator 505 may refers to the radio-frequency signal $x_{\pi/2}$ that has a phase of π/2 and is outputted by the multi-phase radio-frequency signal generator 103, may obtain a coefficient c2 which is a real number that minimizes the size of a vector $(x_{1,0}+x_{1,\pi}+c2\cdot x_{\pi/2})$, and may approximately obtain the vector $y_2$ as $c2\cdot x_{\pi/2}$.

Alternatively, when approximately determining the vector $y_2$, the calibrator 505 may use the radio-frequency signal $x_{-\pi/2}$ having a phase of $-\pi/2$ instead of the radio-frequency signal $x_{\pi/2}$ having a phase of π/2 (step S504).

Based on the vectors $y_1$ and $y_2$, the calibrator 105 calculates a phase shift $\theta_4$ between the radio-frequency signals having phases of 0 and π outputted by the multi-phase radio-frequency signal generator 103 (step S505). The phase shift $\theta_4$ is obtained from the following [Math 2] as $\theta_4 = \text{Im}(y_1+y_2)/m$.

$$x_{1,0} = \sum_{k=1}^{m} u + e_k, \quad x_{1,\pi} = -e^{j\theta_4} \cdot \sum_{k=1}^{m} u + e_{N-k+1} \quad \text{[Math 2]}$$

$$y_1 = -(x_{1,0}+x_{1,\pi}) = -m(1-e^{j\theta_4})u + \sum_{k=1}^{m}(-e_k - e^{j\theta_4}e_{N-k+1})$$

$$x_{2,\pi} = -e^{j\theta_4} \cdot \sum_{k=1}^{m} u + e_k, \quad x_{2,0} = \sum_{k=1}^{m} u + e_{N-k+1}$$

$$y_2 = -(x_{2,0}+x_{2,\pi}) = -m(1-e^{j\theta_4})u + \sum_{k=1}^{m}(e^{j\theta_4}e_k - e_{N-k+1})$$

where, $u$: Ideal unit vector $e_k$: Error vector of $k$th unit which inlcudes a SW and a PA $e^{j\theta_4} \approx 1 + j\theta_4, u = 1,$ Then, $$y_1 = jm\theta_4 + \left[\sum_{k=1}^{m} e_{N-k+1} - \sum_{k=1}^{m} e_k\right] + j\theta_4 \sum_{k=1}^{m} e_{N-k+1} =$$

$$jm\theta_4 + e_{dif} + j\theta_4 \sum_{k=1}^{m} e_{N-k+1}$$

$$y_2 = jm\theta_4 - \left[\sum_{k=1}^{m} e_{N-k+1} - \sum_{k=1}^{m} e_k\right] + j\theta_4 \sum_{k=1}^{m} e_k =$$

$$jm\theta_4 - e_{dif} + j\theta_4 \sum_{k=1}^{m} e_k$$

where, $$e_{dif} = \sum_{k=1}^{m} e_{N-k+1} - \sum_{k=1}^{m} e_k$$

$$y_1 + y_2 = 2jm\theta_4 + j\theta_4 \sum_{k=1}^{m}(e_k + e_{N-k+1}) \approx 2jm\theta_4$$

$$y_1 - y_2 = 2e_{dif} + j\theta_4 e_{dif}$$

$$\therefore \theta_4 = \frac{\text{Im}(y_1+y_2)}{m}, \quad e_{dif} = \frac{y_1-y_2}{2+j\theta_4}$$

Similarly, at the above described steps S501-S504, the detector 506 calculates a phase shift $\theta_6$-$\theta_2$ between the radio-frequency signals having phases of π/2 and $-\pi/2$ outputted from the multi-phase radio-frequency signal generator 103, by using the radio-frequency signals having phases of π/2 and $-\pi/2$ instead of the radio-frequency signals having phases of 0 and π, or by further referring to the radio-frequency signal having a phase of 0. The calibrator 105 stores $\theta_4$ and $\theta_6$-$\theta_2$ in the LUT 507. It should be noted that, shown in FIG. 11(a) in an I-Q plane are: phases of the radio-frequency signal having phases of 0, π/2, π, and $-\pi/2$; and phase difference errors $\theta_2$, $\theta_4$, and $\theta_6$ between the radio-frequency signal having a phase of 0, and respective radio-frequency signals having phases of π/2, π, and $-\pi/2$.

Then, when the multiplexer 102 switches to a state in which the baseband signal is selected, the predistorter 508 generates an in-phase signal $I_O$ and a quadrature-phase signal $Q_O$ based on inputted in-phase signal $I_I$ and quadrature-phase signal $Q_I$ and values of $\theta_4$ and $\theta_6$ stored in the LUT 507 by using a calculation show in FIG. 11(b), and outputs those to the vector controller 170.

The phase distortion of the in-phase signal $I_O$ and the quadrature-phase signal $Q_O$ is offset by the phase distortion of the output signals of the multi-phase radio-frequency signal generator 103.

FIGS. 12(a) and (b) show other examples of the calculation processes by the predistorter 508. In the present embodiment, the calibration coefficient is calculated between radio-frequency signals having phases of 0 and π, or between radio-frequency signals having phases of π/2 and $-\pi/2$, i.e., between radio-frequency signals whose phases are shifted from each other by π; and the calibration coefficient is not calculated between radio-frequency signals whose phases are shifted from each other by π/2, e.g., between radio-frequency signals having phases of 0 and π/2.

Figure 11:
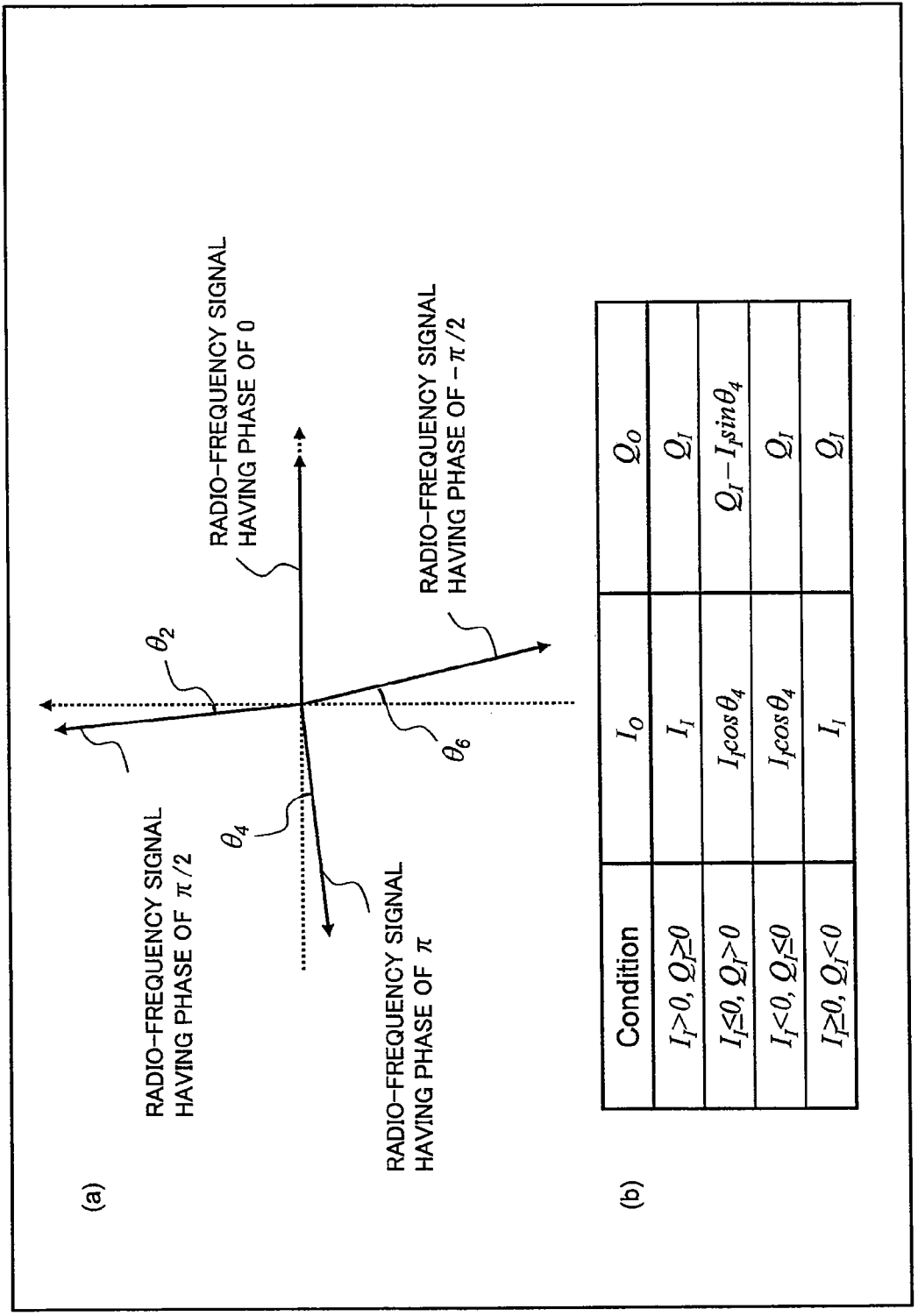
FIG. 11 shows processes executed by the RFDAC 500 according to the fifth embodiment of the present invention.

The calculation shown in FIG. 11 is based on an assumption that the phase difference between the radio-frequency signals having phases of 0 and π/2 has not shifted from π/2. When the deviation between radio-frequency signals whose phases are shifted from each other by π is assumed as $\theta_2$, the calibration may be conducted by the calculation shown in FIG. 12(a). Furthermore, the calculation example shown in FIG. 12(b) is an approximate calculation of FIG. 12(a).

With the configuration described above, the RFDAC 500 can offset the phase error of radio-frequency signals of the multi-phase radio-frequency signal generator 103 through predistortion, and can output high precision output signals.

[Sixth Embodiment]

Figure 13:
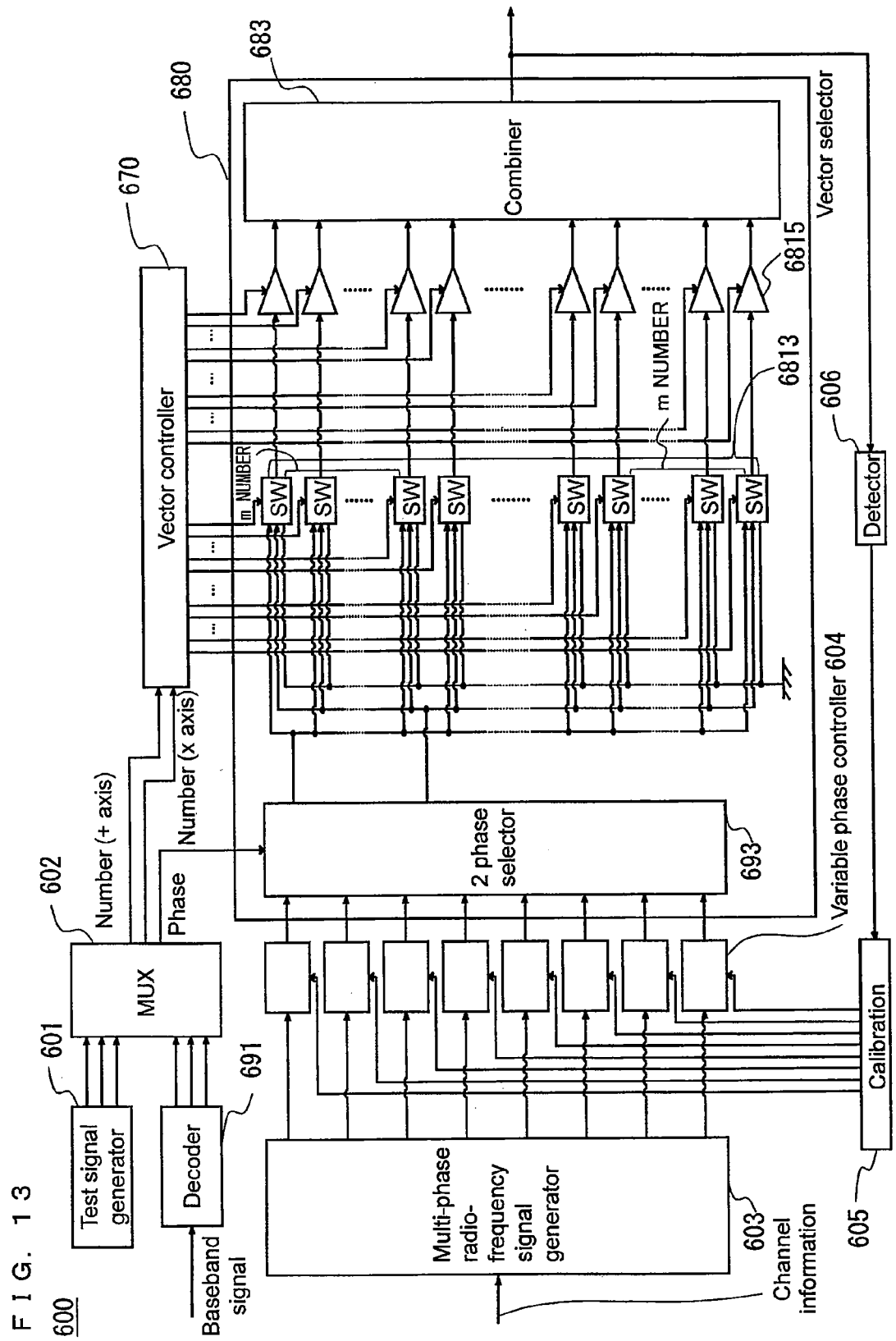
FIG. 13 shows an RFDAC 600 according to a sixth embodiment of the present invention.

FIG. 13 shows a configuration of an RFDAC 600 according to the present embodiment. The RFDAC 600 includes a decoder 691, a test signal generator 601, a multiplexer 602, a vector controller 670, a multi-phase radio-frequency signal generator 603, variable phase controllers 604, a calibrator 605, a detector 606, and a vector selector 680.

Figure 14:
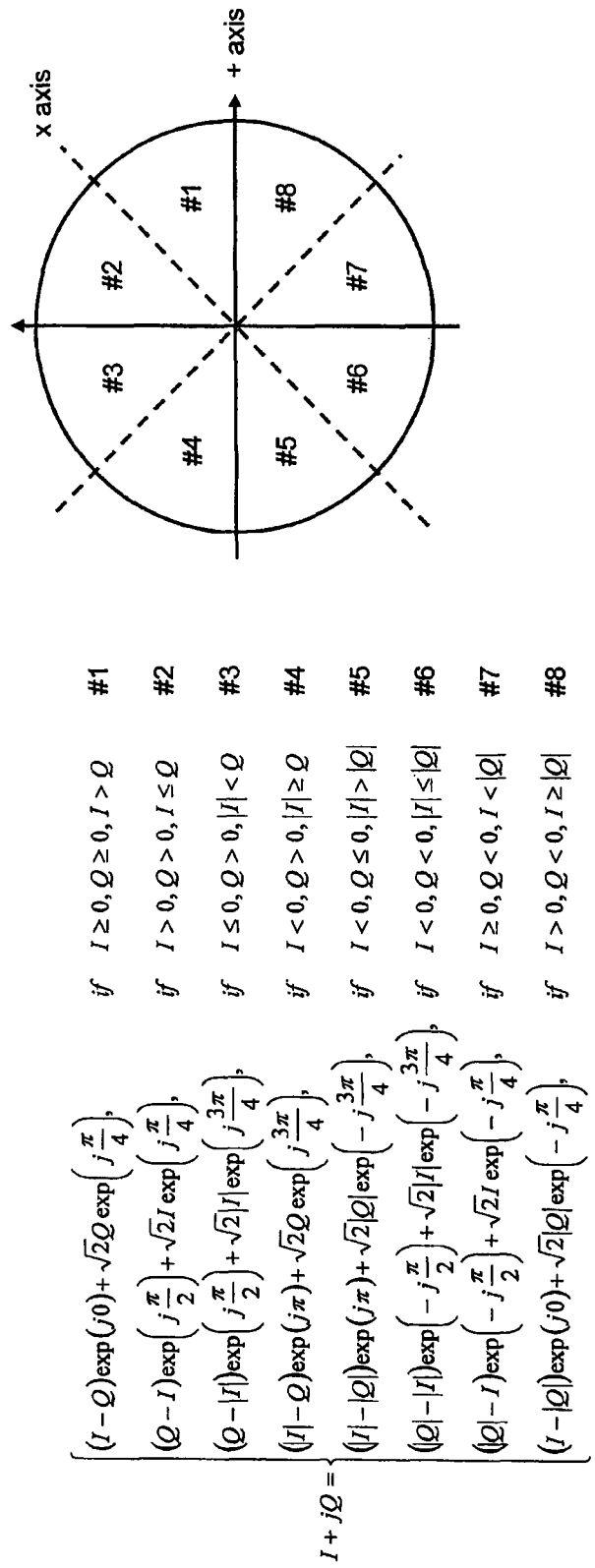
FIG. 14 shows processes executed by the RFDAC 600 according to the sixth embodiment of the present invention.

Based on the baseband signal, the decoder 691 generates and outputs "Number (+ axis)," "Phase (+ axis)," "Number (x axis)," "Phase (x axis)." The relationship between the I-Q signal representing the baseband signal, and "Number (+ axis)," "Phase (+ axis)," "Number (x axis)," "Phase (x axis)" are associated by the formulae shown in FIGS. 14 and 15.

The test signal generator 601 generates and outputs a test signal in the format of "Number (+ axis)," "Phase (+ axis)," "Number (x axis)," "Phase (x axis)." The multiplexer 602 selects either the test signal or the baseband signal represented by the format used by the test signal generator 601, and outputs the selected signal. The vector controller 670 controls the vector selector 680 based on the signal outputted by the multiplexer 602.

The multi-phase radio-frequency signal generator 603 generates multiple radio-frequency signals having mutually different phases. In the present embodiment, eight radio-frequency signals whose respective phases are 0, $\pi/2$, $\pi$, $-\pi/2$, $\pi/4$, $3\pi/4$, $-\pi/4$, and $-3\pi/4$ are outputted. The frequencies of these radio-frequency signals are determined based on channel information inputted to the multi-phase radio-frequency signal generator 603. When the frequencies are fixed, inputting of a channel signal is unnecessary.

Each of the radio-frequency signals outputted from the multi-phase radio-frequency signal generator 603 is inputted to the vector selector 680 via the respective variable phase controllers 604. Under a control by the vector controller 670, the vector selector 680 selects and combines these radio-frequency signals, and the outputs a resulting signal.

The detector 606 detects the output signals from the vector selector 680. The calibrator 605 controls each of the variable phase controllers 604 based on the detected output signal. The variable phase controllers 604 calibrate an inputted radio-frequency signal based on a control by the calibrator 605.

A detailed configuration of the vector selector 680 will be described in the following. The vector selector 680 includes a switch bank 6813 including a two-phase selector 693 and N number (a plurality) of switches, multiple amplifiers 6815, and a combiner 683.

When data is transmitted, the above described eight radio-frequency signals are inputted to the two-phase selector 693. The two-phase selector 693 selects two radio-frequency signals in accordance with "Phase (+ axis)," and "Phase (x axis)."

The vector controller 670 controls each of the switches of the switch bank 6813 based on "Number (+ axis)," and "Number (x axis)," so as to each select either an OFF state, or one of the two radio-frequency signals selected by the two-phase selector 693. Outputs from the switches of the switch bank 6813 are amplified by the respective amplifiers 6815. A group including the switches of the switch bank 6813 and the amplifiers 6815 connected thereto form a single output unit, i.e., a path. The combiner 683 combines outputs from each output unit. A signal combined by the combiner 683 becomes an output of the RFDAC.

Furthermore, the RFDAC 100 may include a controller for controlling all the components described above.

The operation of the RFDAC 600 will be described in accordance with which of the baseband signal and the test signal has been selected by the multiplexer 602.

[Selection of Test Signal: Calibration Operation]

In a state where phase calibration by the variable phase controllers 604 is turned "OFF," the RFDAC 600 sequentially calculates calibration coefficients between two radio-frequency signals whose phases are shifted from each other by $\pi$, i.e., each of the groups of radio-frequency signals whose phases are 0 and $\pi$, $\pi/4$ and $-3\pi/4$, $\pi/2$ and $-\pi/2$, and $3\pi/4$ and $-\pi/4$.

The calibration coefficients can be calculated similarly to steps S101-S105 of the first embodiment. That is, the two-phase selector 693 selects two radio-frequency signal whose phases are shifted from each other by $\pi$; the vector controller 670 causes m number of switches in the switch bank 6813 to select one of the radio-frequency signals, causes the other m number to select the other radio-frequency signal, causes the remainder of the switches to select an OFF state; the detector 606 detects an output from the combiner 683; and thereby a calibration coefficient between two radio-frequency signals can be calculated.

The RFDAC 600 sequentially calculates the calibration coefficients for each of the groups whose phases are 0 and $\pi$, $\pi/4$ and $-3\pi/4$, $\pi/2$ and $-\pi/2$, and $3\pi/4$ and $-\pi/4$.

[Selection of Baseband Signal: Data Transmission Operation]

An operation that is conducted when the baseband signal is inputted after the calibration is performed using the test signal will be described.

The RFDAC 100 is operated for outputting a transmission signal. The phase of each of the radio-frequency signals inputted to the vector selector 680 is calibrated by the variable phase controllers 604.

The vector controller 670 turns "ON" one portion of the switches of the switch bank 6813 and turns "OFF" the remainder of the switches, in accordance with the size of the in-phase signal.

As shown in FIGS. 14 and 15, since the baseband signal is represented as a sum of two vectors in which an angle therebetween is $\pi/4$, a phase difference between the two radio-frequency signals selected by the two-phase selector 693 and inputted to the amplifiers 6815 also becomes $\pi/4$; and the phase difference will not become larger than this, such as $\pi/2$. Thus, reduction in the efficiency of the amplifiers 6815 can be lessened.

The calibrator 605 can conducted the calibration by, in accordance with each of the calculated calibration coefficients: controlling the variable phase controllers 604 connected to each output of the multi-phase radio-frequency signal generator 603; detecting phase errors of each of the groups whose phases are 0 and $\pi$, $\pi/4$ and $-3\pi/4$, $\pi/2$ and $-\pi/2$, and $3\pi/4$ and $-\pi/4$; and adding opposite phases to the detected phase errors.

Thus, the RFDAC 600 can reduce phase distortion, and can output high precision output signals.

Since the baseband signal is outputted from RFDAC after the calibration is performed using the test signal, spectrum regrowth and modulation accuracy degradation can be suppressed.

[Seventh Embodiment]

Figure 16:
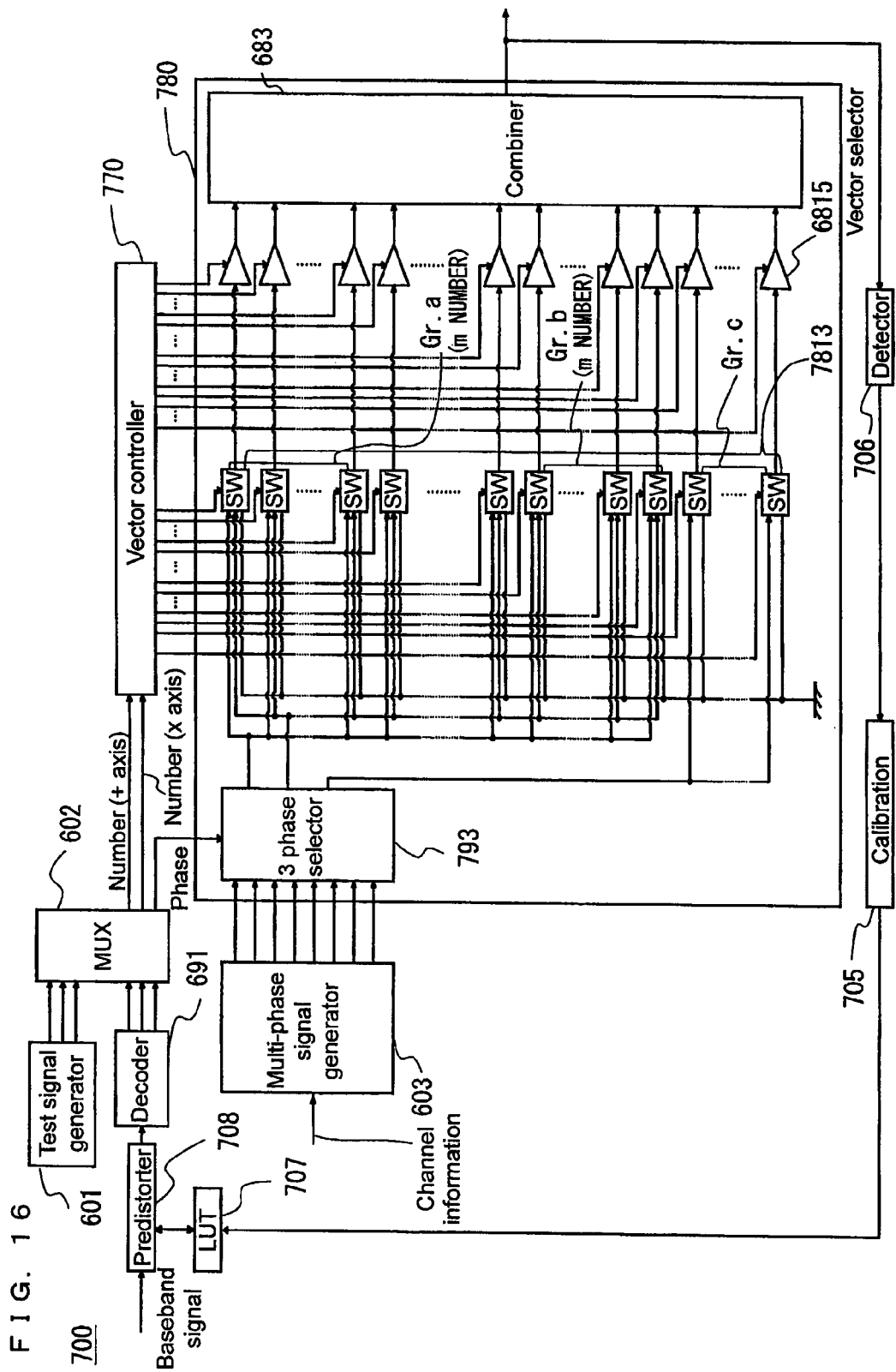
FIG. 16 shows an RFDAC 700 according to a seventh embodiment of the present invention.

FIG. 16 shows a general outline of an RFDAC 700 according to the present embodiment. Instead of having the variable phase controllers 604 and the two-phase selector 693 of the RFDAC 600 according to the sixth embodiment, the RFDAC 700 according to the present embodiment includes a predistorter 508, an LUT (look-up table) 507, and a three-phase selector 793.

Another difference is that the phase distortion of the output signals from the multiplexer 602 is calibrated by a detector 706, a calibrator 705, and the LUT 707, whereas, in the RFDAC 600, the phase distortion of the output signals from the multi-phase radio-frequency signal generator 103 is calibrated. In addition, the configuration of switches in a switch bank 7813 is different from that of the switch bank 6813 in the RFDAC 600.

Among the eight radio-frequency signals outputted from the multi-phase radio-frequency signal generator 603, the three-phase selector 793 selects three radio-frequency signals as first to third radio-frequency signals. The switches in the switch bank 7813 are classified as groups a, b, c, and the others. Switches belonging to group c can select an OFF state and the third radio-frequency signal. Switches that do not belong to group c can select an OFF state and the first and second radio-frequency signals.

[Selection of Test Signal: Calibration Operation]

An operation of calibrating the phase distortion in the present embodiment will be described. When the multiplexer 602 selects the test signal and in a state where phase calibration is turned "OFF," the RFDAC 700 sequentially calculates calibration coefficients between two radio-frequency signals whose phases are shifted from each other by $\pi$, i.e., each of groups of radio-frequency signals whose phases are 0 and $\pi$, $\pi/4$ and $-3\pi/4$, $\pi/2$ and $-\pi/2$, and $3\pi/4$ and $-\pi/4$. The calibration coefficients can be calculated similarly to steps S501-S505 in the fifth embodiment.

Thus, the three-phase selector 793 selects, as the first and second radio-frequency signals, two radio-frequency signals whose phases are shifted from each other by $\pi$; and selects, as the third radio-frequency signal, one of two radio-frequency signals whose phases are shifted by $\pi/2$ from the two radio-frequency signals that have been selected as the first and second radio-frequency signals. Among the switches of the switch bank 7813, a vector controller 770 causes m number of switches belonging to group a to select the first radio-frequency signal, causes m number of switches belonging to group b to select the second radio-frequency signal, and causes the remainder of the switches to be in an OFF state.

In addition, the vector controller 770 appropriately switches each of the switches belonging to group c between an OFF state and a state in which the third radio-frequency signal is selected, and changes the output level of the third radio-frequency signal.

The detector 706 detects the output from the combiner 683, and obtains calibration vectors $y_1$ and $y_2$ based on the output level of the third radio-frequency signal obtained when the level of output from the combiner 683 becomes the smallest. Processing by the detector 706 correspond to approximately obtaining the calibration vector $y_1$ and $y_2$ at step S502 and S504 in the fifth embodiment.

The calibrator 705 calculates calibration coefficients $\theta_4$, $\theta_5$, $\theta_6$, and $\theta_7$ between each of the groups of radio-frequency signals whose phases are respectively, 0 and $\pi$, $\pi/4$ and $-3\pi/4$, $\pi/2$ and $-\pi/2$, and $3\pi/4$ and $-\pi/4$, as the first and second radio-frequency signals selected by the three-phase selector 793. The calibrator 705 stores the calibration coefficients in the LUT 707.

[Selection of Baseband Signal: Data Transmission Operation]

An operation that is conducted when the baseband signal is inputted after the calibration is performed using the test signal will be described.

When the baseband signal is selected by the multiplexer 102, based on "Phase (+ axis)" and "Phase (x axis)" inputted from the multiplexer 602, the three-phase selector 793 selects two radio-frequency signals as the first and second radio-frequency signals, in accordance with phases represented by the inputted "Phase (+ axis)" and "Phase (x axis)." The vector controller 670 controls each of the switches of the switch bank 7813 other than those in group c so as to select whether to output a radio-frequency signal, by using one of the output units including these switches.

The predistorter 708 generates the in-phase signal $I_O$ and the quadrature-phase signal $Q_O$ using the calculation shown in FIG. 17, based on the inputted in-phase signal $I_I$ and quadrature-phase signal $Q_I$ and values of the calibration coefficients $\theta_4$, $\theta_5$, $\theta_6$, and $\theta_7$ stored in the LUT 707, and outputs the generated in-phase signal $I_O$ and quadrature-phase signal $Q_O$ to the decoder 691. The phase distortion of the in-phase signal $I_O$ and the quadrature-phase signal $Q_O$ is offset by the phase distortion of the output signals of the multi-phase radio-frequency signal generator 103. Alternatively, based on a premise of $\theta_4$, $\theta_5$, $\theta_6$ and $\theta_7 \ll 1$, the predistorter 508 may conduct an approximate calculation shown in FIG. 18. It should be noted that, $\theta_1$, $\theta_2$, and $\theta_3$ shown in FIG. 17 and FIG. 18 are error amounts from ideal vectors of respective radio-frequency signals having phases of $\pi/4$, $\pi/2$, and $3\pi/4$ when the radio-frequency signal having a phase of 0 is used as a standard, and $\theta_1$, $\theta_2$, and $\theta_3$ may be assumed as, for example, 0 for the calculation.

[Eighth Embodiment]

FIG. 19 shows a general outline of an RFDAC 800 according to the present embodiment. A configuration of switches of a switch bank 8813 in the RFDAC 800 according to the present embodiment is different from the switch bank 7813 in the RFDAC 700 according to the seventh embodiment.

The switches in the switch bank 8813 are classified as groups a, b, c, and the others. Each of the switches can select an OFF state and the first to third radio-frequency signals. The switches included in group c are not fixed.

Group c is dynamically formed, as a result of having a vector controller 870 control one portion of the switches not belonging to groups a and b so as to select the third radio-frequency signal. In the present embodiment, the calibration coefficients of phase distortion can be calculated similarly to steps S501-S505 in the fifth embodiment.

[Ninth Embodiment]

Figure 20:
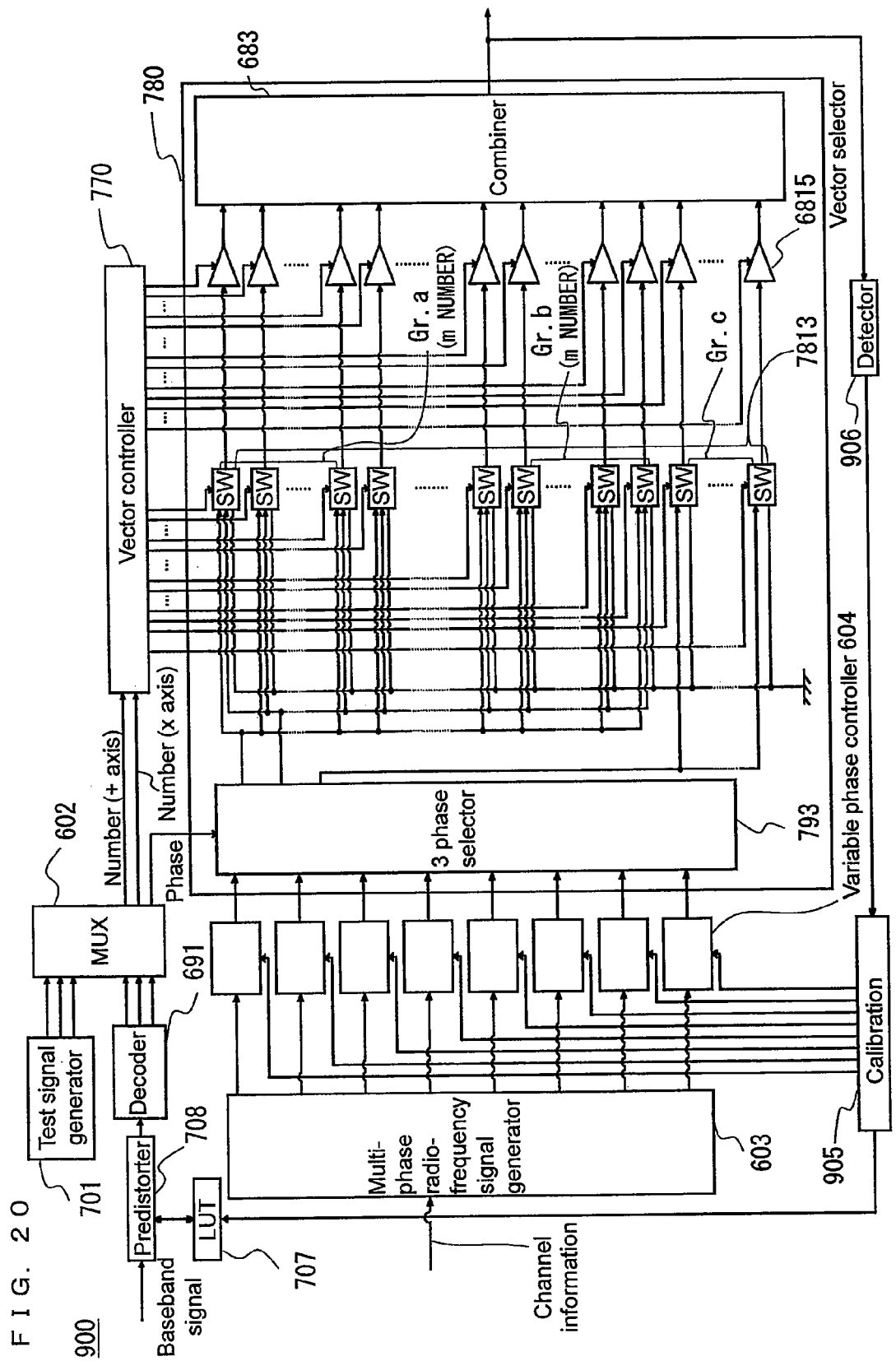
FIG. 20 shows an RFDAC 900 according to a ninth embodiment of the present invention.

FIG. 20 shows a general outline of an RFDAC 900 according to the present embodiment. The RFDAC 900 according to the present embodiment has a configuration obtained by including the variable phase controllers 604 of the RFDAC 600 according to the sixth embodiment in the RFDAC 700 according to the seventh embodiment. A detector 906 and a calibrator 905 have functions of the detector 606 and the calibrator 605 according to the sixth embodiment, and functions of the detector 706 and the calibrator 705 according to the seventh embodiment.

With the configuration described above, the RFDAC 900 can calibrate distortions of radio-frequency signals outputted from the multi-phase radio-frequency signal generator 603, and can conduct predistortion on the baseband signal inputted to the decoder 691.

For example, since the RFDAC 900 makes a rough adjustment through calibration of the radio-frequency signals outputted by the multi-phase radio-frequency signal generator 603 and then makes a fine adjustment through predistortion of the baseband signal, the number of amplifiers and switches for group c can be reduced, phase distortion can be further reduced, and output signals can be generated with higher precision.

[Tenth Embodiment]

An RFDAC 1000 according to the present embodiment, which is formed by any one of the RFDACs 500, 700, 800, and 900 according to the fifth, and seventh to ninth embodiments, calibrates a phase error between the multi-phase radio-frequency signal generators 103 and 603, and calibrates a phase shift between the output units formed by switches and PAs.

Figure 21:
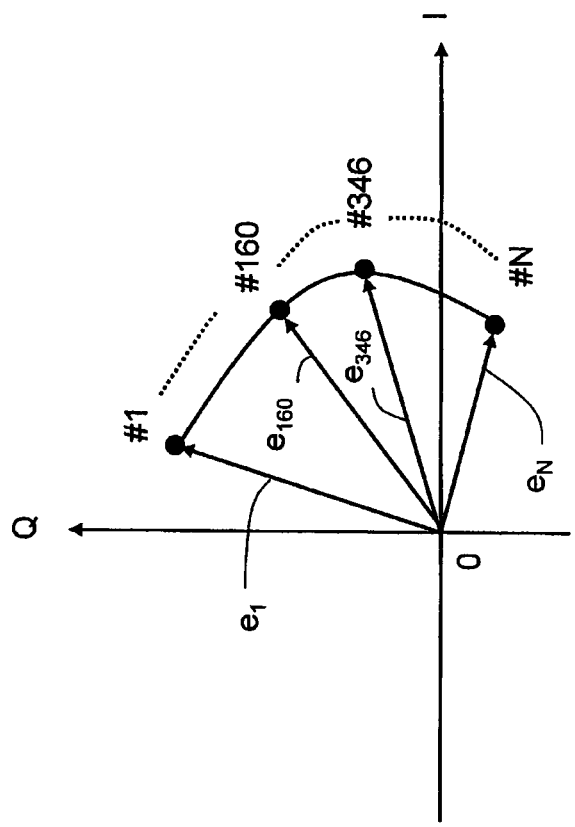
FIG. 21 shows an example of an error vector with an RFDAC 1000 according to a tenth embodiment of the present invention.

When m=1 is set for the calculation process of the calibration coefficients in each of the embodiments, calibration coefficients can be calculated in accordance with an error vector $e_k$ representing a phase error of a k-th output unit (k=1, 2, ..., N) by using $e_{dif}$ if a shift in a delay amount of a phase between each of the output units represented by $e_{dif}$ in [Math 2] is obtained for each of the units. FIG. 21 shows examples of error vectors of four output units (k=1, 160, 346, N). It should be noted that, even when m≠1, a vector error of a single unit can be calculated through calculation of errors of multiple vectorial sums.

When the RFDAC 500, 700, or 800 is applied in the present embodiment, the LUT 507 or 707 stores calibration coefficients of both phase errors for each of the output units and the multi-phase radio-frequency signal generator, and the predistorter 508 or 708 calibrates phase distortions attributed to both a phase error of each of the output units and a phase error of the multi-phase radio-frequency signal generator 103 or 603.

Furthermore, when the RFDAC 900 is applied in the present embodiment, similarly, the predistorter 708 may calibrate phase distortions attributed to both a phase error of each of the output units and a phase error of the multi-phase radio-frequency signal generator 603; or the predistorter 708 may calibrate phase distortions attributed to a phase error of each of the output units, and the variable phase controllers 604 may calibrate phase distortions attributed to an amplitude error or a phase error of the multi-phase radio-frequency signal generator 603. By calibrating phase distortions among the output units, output signals can be generated with higher precision.

In the RFDAC according to each of the above described embodiments, frequency of the radio-frequency signal outputted by the multi-phase radio-frequency signal generator is determined based on channel information inputted to the multi-phase radio-frequency signal generator; however, when the frequency is fixed, inputting of channel information can be omitted.

The RFDAC according to each of the embodiments may include a controller for controlling all the components, and control wires connecting the controller and each of the components. Furthermore, in each of the embodiment, the calibration by the variable phase controller and the predistortion by the predistorter can be switched.

Figure 22:
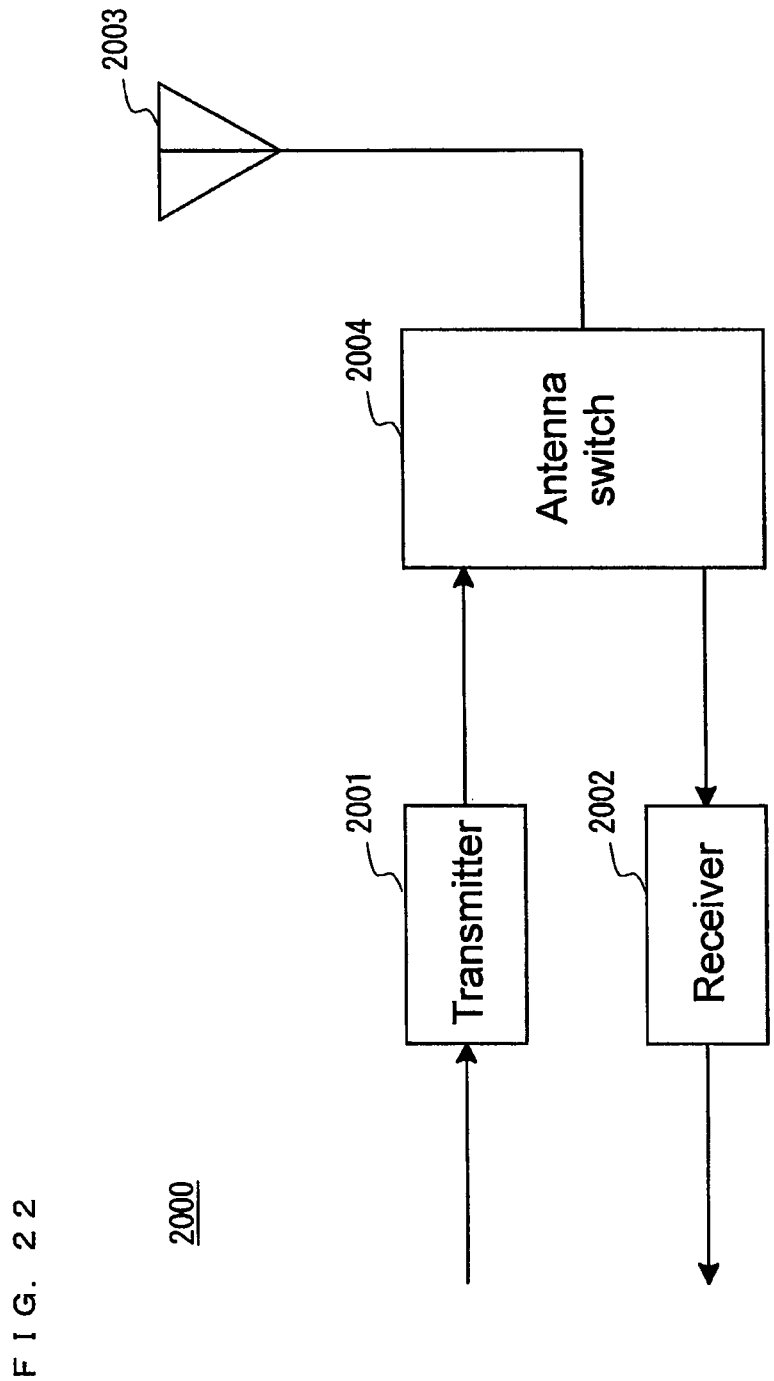
FIG. 22 shows a wireless communication apparatus 2000 according to an application example of the present invention.

The above described RFDAC according to the present invention can be applied in a wireless communication apparatus. FIG. 22 shows a configuration of a wireless communication apparatus 2000. The wireless communication apparatus 2000 includes a transmitter 2001 incorporated with the RFDAC according to the present invention, a receiver 2002, an antenna 2003, and an antenna switch 2004 connected to those. A duplexer may be used instead of the antenna switch 2004.

The calibration coefficient may be calculated when power of the wireless communication apparatus 2000 is turned on, may be calculated when the wireless communication apparatus 2000 is receiving a signal and when it is not necessary to use the RFDAC 2001 for transmission, or may be calculated when the wireless communication apparatus 2000 is not transmitting or receiving a signal.

While the invention has been described in detail, the foregoing description is in all aspects illustrative and not restrictive. It will be understood that numerous other modifications and variations can be devised without departing from the scope of the invention.

Furthermore, in the above described embodiments, examples have been described in which the present invention is formed as hardware; however, it is also possible to achieve at least one portion of the present invention as software through cooperation with hardware.

The invention claimed is:

1. An RFDAC (Radio Frequency Digital to Analog Converter) for conducting digital-to-analog conversion on a baseband signal, the RFDAC comprising:
   a multi-phase radio-frequency signal generator configured to generate multiple pairs of radio-frequency signals in which a phase difference among each of the multiple pairs is $\pi$;
   a vector selector configured to combine each of the multiple radio-frequency signals which has passed through at least one path;
   a test signal generator configured to generate a test signal;
   a multiplexer configured to select either the test signal or the baseband signal;
   a vector controller configured to control the vector selector so as to select a path for each of the multiple pairs of the radio-frequency signals by using a signal selected by the multiplexer;
   a detector configured to detect output signals outputted from the vector selector; and
   a calibrator
      configured to, when the multiplexer selects the test signal, calculate a calibration coefficient of a phase error between the radio-frequency signals of the each of the multiple pairs of the radio-frequency signals outputted by multi-phase radio-frequency signal generator, based on the output signals detected by the detector, and
      configured to, when the multiplexer selects the baseband signal, calibrate the multiple radio-frequency signals or the baseband signal by using the calibration coefficient.

2. The RFDAC according to claim 1, wherein
   when the multiplexer selects the test signal:
   the vector selector exchanges paths within each of the multiple pairs of the radio-frequency signals; signals;
   the calibrator calculates the phase error between the radio-frequency signals corresponding to the multiple pairs of the radio-frequency signals, based on a phase error between each the output signals before and after exchanging of the paths.

3. The RFDAC according to claim 2, wherein
   when the multiplexer selects the test signal,
   for each of the multiple pairs of the radio-frequency signals,
   the calibrator
      obtains, when a radio-frequency signal of one member a pair passes through a first path and a radio-frequency signal of the other member of the pair passes through a second path, a phase error $\theta_{1,c}$ between the radio-frequency signals corresponding to the pair, based on the output signals,
      obtains, when the radio-frequency signal of the one member of the pair passes through the second path and the radio-frequency signal of the other member of the pair passes through the first path, a phase error $\theta_{2,c}$ between the radio-frequency signals corresponding to the pair, based on the output signals, and
      calculates, using a formula of $\theta_4 = -(\theta_{1,c} + \theta_{2,c})/2$, a phase calibration coefficient for the pair generated by the multi-phase radio-frequency signal generator.

4. The RFDAC according to claim 2, wherein
when the multiplexer selects the test signal,
for each of the multiple pairs of the radio-frequency signals,
the calibrator
  obtains, when a radio-frequency signal of one member of a pair passes through a first path and a radio-frequency signal of the other member of the pair passes through a second path, a vector error $y_1$ between the radio-frequency signals corresponding to the pair, based on the output signals,
  obtains, when the radio-frequency signal of the one member of the pair passes through the second path and the radio-frequency signal of the other member of the pair passes through the first path, a vector error $y_2$ between the radio-frequency signals corresponding to the pair, based on the output signals, and
  calculates, using a formula of $\theta_4=\mathrm{Im}(y_1+y_2)/m$ (here, m represents a number of routes included in each of the first and second paths), a phase calibration coefficient for the pair generated by the multi-phase radio-frequency signal generator.

5. The RFDAC according to claim 4, wherein for each of the multiple pairs of the radio-frequency signals, when level of the output signals including the radio-frequency signals corresponding to the pair and a single radio-frequency signal not included in the pair becomes a minimum, the calibrator approximately calculates the vector errors $y_1$ and $y_2$ between the radio-frequency signals corresponding to the pair, based on a size and direction of a vector represented by the minimum output signal.

6. The RFDAC according to claim 4, wherein
when the multiplexer selects the test signal,
for each of the multiple pairs of the radio-frequency signals,
the calibrator further calculates, using a formula of $e_{dif}=(y_1+y_2)/(2+j\theta_4)$ (here, formula $\theta_4=\mathrm{Im}(y_1+y_2)/m$: m represents a number of routes included in each of the first and second paths), a vector error between the first path and the second path, based on the vector errors $y_1$ and $y_2$.

7. The RFDAC according to claim 1, further comprising a variable phase controller connected to an antecedent stage of the vector selector, and configured to control each phase of the multiple radio-frequency signals outputted from the multi-phase radio-frequency signal generator, based on the calibration coefficient calculated by the calibrator.

8. The RFDAC according to claim 1, further comprising:
an LUT (look-up table) having stored therein the calibration coefficient calculated by the calibrator, based on the phase error; and
a predistorter connected to an antecedent stage of the vector controller, and configured to conduct predistortion on the baseband signal outputted by the multiplexer, based on the calibration coefficient stored in the LUT.

9. The RFDAC according to claim 2, wherein
the multiple pairs of the high-frequency wave signals include a first phase-pair that is a pair of radio-frequency signals corresponding to phases of 0 and $\pi$, and a second phase-pair that is a pair of radio-frequency signals corresponding to phases of $\pi/2$ and $-\pi/2$, and
the baseband signal includes an in-phase signal and a quadrature-phase signal, and the test signal includes an in-phase component control signal and a quadrature-phase component control signal.

10. The RFDAC according to claim 9, wherein:
the vector controller includes an in-phase signal amplitude-and-phase controller, and a quadrature-phase signal amplitude-and-phase controller;
the vector selector includes an in-phase signal vector selector, a quadrature-phase signal vector selector, and a combiner;
the in-phase signal amplitude-and-phase controller controls the in-phase signal vector selector so as to select a path for each of the multiple pairs of the radio-frequency signals, based on a first signal which is the in-phase signal, when the multiplexer selects the baseband signal, or based on a first signal which is the in-phase component control signal, when the multiplexer selects the test signal;
the quadrature-phase signal amplitude-and-phase controller controls the quadrature-phase signal vector selector so as to select a path for a radio-frequency signal of each pair of radio-frequency signals that are different from the pair of radio-frequency signals used by the in-phase signal amplitude-and-phase controller, based on a second signal which is the quadrature-phase signal, when the multiplexer selects the baseband signal, or based on a second signal which is the quadrature-phase component control signal, when the multiplexer selects the test signal; and
the combiner combines each of the radio-frequency signals outputted by the in-phase signal amplitude-and-phase controller and the quadrature-phase signal amplitude-and-phase controller.

11. The RFDAC according to claim 10, wherein:
the in-phase signal vector selector includes a switch bank having multiple switches configured to select either an OFF state or radio-frequency signal corresponding to the first phase-pair among the multiple pairs of the radio-frequency signals;
the quadrature-phase signal vector selector includes a switch bank having multiple switches configured to select either an OFF state or radio-frequency signal corresponding to the second phase-pair among the multiple pairs of the radio-frequency signals;
the in-phase signal amplitude-and-phase controller includes an in-phase signal unit selector configured to control each of the switches in the switch bank; and
the quadrature-phase signal amplitude-and-phase controller includes a quadrature-phase signal unit selector configured to control each of the switches in the switch bank.

12. The RFDAC according to claim 11, wherein:
the in-phase signal vector selector further includes
  a first switch configured to select one among the radio-frequency signals corresponding to the first phase-pair, and
  a second switch configured to select the radio-frequency signal that has not been selected by the first switch;
the switch bank of the in-phase signal vector selector includes a first switch bank corresponding to the first switch, and a second switch bank corresponding to the second switch;
the in-phase signal amplitude-and-phase controller includes an in-phase signal phase controller configured to control the first and second switches;
the quadrature-phase signal vector selector further includes third and fourth switches configured to select one among the radio-frequency signals corresponding to the second phase-pair;

the switch bank of the quadrature-phase signal vector selector includes a third switch bank corresponding to the third switch, and a fourth switch bank corresponding to the fourth switch; and the quadrature-phase signal amplitude-and-phase controller includes a quadrature-phase signal phase controller configured to control the third and fourth switches.

13. The RFDAC according to claim 10, wherein:

the in-phase signal vector selector includes
- a first switch configured to select one among the radio-frequency signals corresponding to the first phase-pair among the multiple pairs of the radio-frequency signals,
- a second switch configured to select the radio-frequency signal that have not been selected by the first switch,
- a first amplifier configured to amplify, based on the first signal, the radio-frequency signal selected by the first switch, and
- a second amplifier configured to amplify, based on the first signal, the radio-frequency signal selected by the second switch;

the in-phase signal amplitude-and-phase controller includes
- an in-phase signal phase controller configured to control the first and second switches in accordance with the first signal, and
- an in-phase signal amplitude controller configured to control an amplification factor of each of the first and second amplifiers in accordance with the first signal;

the quadrature-phase signal vector selector includes
- a third switch configured to select one among the radio-frequency signals corresponding to the second phase-pair among the multiple pairs of the radio-frequency signals,
- a fourth switch configured to select the radio-frequency signal that has not been selected by the second switch,
- a third amplifier configured to amplify, in accordance with the second signal, the radio-frequency signal selected by the third switch, and
- a fourth amplifier configured to amplify, in accordance with the second signal, the radio-frequency signal selected by the fourth switch;

the quadrature-phase signal amplitude-and-phase controller includes
- a quadrature-phase signal phase controller configured to control the third and fourth switches in accordance with the second signal, and
- a quadrature-phase signal amplitude controller configured to control an amplification factor of each of the third and fourth amplifiers in accordance with the second signal; and when the multiplexer selects the test signal,
- the in-phase signal amplitude controller conducts a control so as to equalize amplification factors of the first and second amplifiers, and
- the quadrature-phase signal amplitude controller conducts a control so as to equalize the amplification factors of the third and fourth amplifiers.

14. The RFDAC according to claim 9, wherein:

the vector controller includes an in-phase signal amplitude-and-phase controller, and a quadrature-phase signal amplitude-and-phase controller;

the vector selector includes an in-phase signal vector selector, a quadrature-phase signal vector selector, a combiner, and first and second switches configured to select radio-frequency signals of the first phase-pair among the multiple pairs of the radio-frequency signals;

the in-phase signal vector selector includes a fifth switch bank having multiple switches configured to select either an OFF state or the radio-frequency signal selected by the first switch;

the in-phase signal amplitude-and-phase controller includes
- an in-phase signal phase controller configured to control the first switch, and
- an in-phase signal unit selector configured to control each of the switches of the first switch bank;

the quadrature-phase signal vector selector includes a sixth switch bank having multiple switches configured to select either an OFF state or the radio-frequency signal selected by the second switch; and the quadrature-phase signal amplitude-and-phase controller includes
- an in-phase signal phase controller configured to control the second switch, and
- a quadrature-phase signal unit selector configured to control each of the switches of the second switch bank.

15. The RFDAC according to claim 1, further comprising a decoder configured to receive the baseband signal which is an I-Q signal, configured to convert the baseband signal into a linear sum of two vectors in which an angle therebetween is $\pi/4$, and that have non-negative coefficients, and that are two among eight vectors whose directions are in eight phases of $-\pi/2$, $0$, $\pi/2$, $\pi$, $-3\pi/4$, $-\pi/4$, $\pi/4$, and $3\pi/4$, and configured to output, in a predetermined format, information regarding phases and sizes of the two vectors; wherein the multi-phase radio-frequency signal generator generates and outputs, as the multiple radio-frequency signals, eight radio-frequency signals corresponding to the eight phases;

when the multiplexer selects the test signal,
- the vector selector is controlled so as to sequentially select a pair that is from among the eight radio-frequency signals and in which a phase difference among the pair is $\pi$, and
- the calibrator sequentially calculates, based on an output from the vector selector detected by the detector, a phase error among a pair that is from among the eight radio-frequency signals and in which a phase difference among the pair is $\pi$; and when the multiplexer selects the baseband signal,
- the vector controller controls the vector selector so as to select radio-frequency signals corresponding to phases of the two vectors, among the eight radio-frequency signals.

16. The RFDAC according to claim 15, wherein:

the vector selector includes
- a two-phase selector configured to select two radio-frequency signals among the eight radio-frequency signals,
- a switch bank having, as paths of the two radio-frequency signals selected by the two-phase selector, multiple switches configured to each select either an OFF state or one of the two radio-frequency signals selected by the two-phase selector, and
- a combiner configured to combine radio-frequency signals selected by each of the switches of the switch bank;

when the multiplexer selects the test signal,
- the two-phase selector selects, among the eight radio-frequency signals, a first pair in which a phase difference among the pair is $\pi$, the vector controller sequentially controls each of the switches, and causes paths to be exchanged within the first pair, the calibrator calculates a phase error between radio-frequency signals corresponding to the first and second phases generated by the multi-phase radio-frequency signal generator, based on the output signals each detected by the detector;

when the multiplexer selects the baseband signal, the two-phase selector selects two radio-frequency signals corresponding to phases of the two vectors, and the vector controller controls each of the switches of the switch bank so as to each select either an OFF state or one of the two radio-frequency signals, based on a size of the two vectors.

17. The RFDAC according to claim 15, wherein:
the vector selector includes
  a three-phase selector configured to select first, second, and third radio-frequency signals among the eight radio-frequency signals,
  a switch bank having, as paths of the first, second, and third radio-frequency signals, multiple switches configured to each select either an OFF state or one of the first and second radio-frequency signals selected by the three-phase selector, and multiple switches configured to each select either an OFF state or the third radio-frequency signal, and
  a combiner configured to combine the radio-frequency signals selected by each of the switches of the switch bank;

when the multiplexer selects the test signal,
  the three-phase selector selects, as the first, second, and third radio-frequency signals, radio-frequency signals each corresponding to the pair having a first phase and a second phase in which a phase difference therebetween is $\pi$ and to a third phase whose phase difference from the first and second phases is $\pi/2$,
  the vector controller sequentially controls each of the switches, and causes paths to be exchanged within the pair of the first phase and the second phase from among the switches of the switch bank, and
  the calibrator calculates, when an output level of the output signals detected by the detector becomes a minimum, a phase error between the first and second radio-frequency signals generated by the multi-phase radio-frequency signal generator, based on an output level of the third radio-frequency signal; and when the multiplexer selects the baseband signal,
  the three-phase selector selects, as radio-frequency signals corresponding to the first and second phases, two radio-frequency signals corresponding to the phases of the two vectors, and the vector controller controls each of the switches of the switch bank so as to each select either an OFF state or one of the two radio-frequency signals, based on the size of the two vectors.

18. The RFDAC according to claim 15, wherein:
the vector selector includes
  a three-phase selector configured to select, first, second, and third radio-frequency signals among the eight radio-frequency signals,
  a switch bank having, as paths of the first, second, and third radio-frequency signals, multiple switches configured to each select either an OFF state or one of the first, second, and third radio-frequency signals selected by the three-phase selector, and
  a combiner configured to combine the radio-frequency signals selected by each of the switches of the switch bank;

when the multiplexer selects the test signal,
  the three-phase selector selects, as the first, second, and third radio-frequency signals, radio-frequency signals corresponding to the pair having a first phase and a second phase in which a phase difference therebetween is $\pi$ and to a third phase whose phase difference from the first and second phases is $\pi/2$,
  the vector controller sequentially controls each of the switches, and causes respective paths of the first phase, the second phase, and the third phase to be exchanged from among the switches of the switch bank, and
  the calibrator calculates, when an output level of the output signals detected by the detector becomes a minimum, a phase error between the first and second radio-frequency signals generated by the multi-phase radio-frequency signal generator, based on an output level of the third radio-frequency signal; and when the multiplexer selects the baseband signal,
  the three-phase selector selects, as the first and second radio-frequency signals, two radio-frequency signals corresponding to the phases of the two vectors, and
  the vector controller controls each of the switches of the switch bank so as to each select either an OFF state or one of the two radio-frequency signals, based on the size of the two vectors.

19. A wireless communication apparatus comprising:
an antenna;
an antenna switch connected to the antenna;
a receiver connected to the antenna switch; and
a transmitter connected to the antenna switch and having incorporated therein the RFDAC according to claim 1.

* * * * *